United States Patent
Fujii et al.

(10) Patent No.: US 8,860,011 B2
(45) Date of Patent: Oct. 14, 2014

(54) SEMICONDUCTOR DEVICE, AND ELECTRONIC BOOK INCLUDING DOUBLE-SIDED LIGHT EMITTING DISPLAY PANEL

(75) Inventors: Teruyuki Fujii, Kanagawa (JP); Shunpei Yamazaki, Tokyo (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 345 days.

(21) Appl. No.: 13/334,150

(22) Filed: Dec. 22, 2011

(65) Prior Publication Data

US 2012/0146065 A1   Jun. 14, 2012

Related U.S. Application Data

(60) Continuation of application No. 11/695,110, filed on Apr. 2, 2007, now Pat. No. 8,084,081, which is a division of application No. 10/760,716, filed on Jan. 21, 2004, now Pat. No. 7,199,520.

(30) Foreign Application Priority Data

Jan. 24, 2003   (JP) ................. 2003-016409

(51) Int. Cl.

| | |
|---|---|
| H01L 29/08 | (2006.01) |
| H01J 1/62 | (2006.01) |
| G09G 3/10 | (2006.01) |
| G09G 5/00 | (2006.01) |
| B05D 5/06 | (2006.01) |
| H01L 27/32 | (2006.01) |
| H01L 51/00 | (2006.01) |
| H01L 51/52 | (2006.01) |

(52) U.S. Cl.

CPC ......... *H01L 27/3267* (2013.01); *H01L 51/0011* (2013.01); *H01L 51/5262* (2013.01); *H01L 2251/558* (2013.01); *H01L 51/5237* (2013.01)

USPC ............... 257/40; 257/72; 257/98; 257/100; 257/433; 257/447; 313/500; 313/503; 313/509; 315/169.3; 345/5; 345/82; 427/66

(58) Field of Classification Search

CPC ............ H01L 51/0545; H01L 51/5012; H01L 51/5262; H01L 27/3253; H01L 27/3267

See application file for complete search history.

(56) References Cited

U.S. PATENT DOCUMENTS

| | | |
|---|---|---|
| 4,995,043 A | 2/1991 | Kuwata et al. |
| 5,167,508 A | 12/1992 | McTaggart |

(Continued)

FOREIGN PATENT DOCUMENTS

| | | |
|---|---|---|
| EP | 0388608 A1 | 9/1990 |
| EP | 0845924 A2 | 6/1998 |

(Continued)

OTHER PUBLICATIONS

Office Action (European Patent Application No. 04702075.5) mailed Jul. 4, 2012.

(Continued)

*Primary Examiner* — Alonzo Chambliss
(74) *Attorney, Agent, or Firm* — Fish & Richardson P.C.

(57) ABSTRACT

One pixel is divided into a first region including a first light emitting element and a second region including a second light emitting element, wherein the first region emits light in one direction and the second region emits light in the direction opposite to that of the first region. Independently driving the first light emitting element and the second light emitting element allows images to be displayed independently on the surface.

36 Claims, 12 Drawing Sheets

(56) References Cited

U.S. PATENT DOCUMENTS

| | | | |
|---|---|---|---|
| 5,417,575 A | 5/1995 | McTaggart | |
| 5,484,292 A | 1/1996 | McTaggart | |
| 5,493,129 A | 2/1996 | Matsuzaki et al. | |
| 5,609,488 A | 3/1997 | McTaggart | |
| 5,652,067 A | 7/1997 | Ito et al. | |
| 5,680,488 A | 10/1997 | Shimooku | |
| 5,703,436 A | 12/1997 | Forrest et al. | |
| 5,780,174 A | 7/1998 | Tokito et al. | |
| 6,021,306 A | 2/2000 | McTaggart | |
| 6,118,212 A | 9/2000 | Nakaya et al. | |
| 6,124,851 A | 9/2000 | Jacobson | |
| 6,284,393 B1 | 9/2001 | Hosokawa et al. | |
| 6,304,309 B1 | 10/2001 | Yamanaka et al. | |
| 6,333,065 B1 | 12/2001 | Arai et al. | |
| 6,396,209 B1 | 5/2002 | Kido et al. | |
| 6,424,093 B1 | 7/2002 | Mir et al. | |
| 6,466,292 B1 | 10/2002 | Kim | |
| 6,542,205 B2 | 4/2003 | Ohtani et al. | |
| 6,611,097 B1 | 8/2003 | Hanahara et al. | |
| 6,661,563 B2 | 12/2003 | Hayashi et al. | |
| 6,690,110 B1 | 2/2004 | Yamada et al. | |
| 6,819,309 B1 | 11/2004 | Kishi | |
| 6,894,312 B2* | 5/2005 | Yamazaki et al. | 257/72 |
| 6,906,705 B2 | 6/2005 | Matsuo et al. | |
| 7,012,364 B2 | 3/2006 | Mori et al. | |
| 7,116,044 B2* | 10/2006 | Fukunaga | 313/498 |
| 7,199,520 B2 | 4/2007 | Fujii et al. | |
| 7,215,313 B2 | 5/2007 | Giraldo et al. | |
| 7,333,077 B2* | 2/2008 | Koyama et al. | 345/76 |
| 7,355,338 B2* | 4/2008 | Osame et al. | 313/503 |
| 7,608,992 B2 | 10/2009 | Kobayashi | |
| 7,622,863 B2* | 11/2009 | Seo et al. | 313/506 |
| 7,750,552 B2* | 7/2010 | Yamazaki et al. | 313/503 |
| 8,084,081 B2 | 12/2011 | Fujii et al. | |
| 2001/0026846 A1 | 10/2001 | Yamazaki et al. | |
| 2001/0043046 A1 | 11/2001 | Fukunaga | |
| 2001/0045558 A1 | 11/2001 | Kawasaki et al. | |
| 2001/0046081 A1 | 11/2001 | Hayashi et al. | |
| 2001/0055384 A1 | 12/2001 | Yamazaki et al. | |
| 2002/0011783 A1 | 1/2002 | Hosokawa | |
| 2002/0015019 A1 | 2/2002 | Kinjo | |
| 2002/0063518 A1* | 5/2002 | Okamoto et al. | 313/506 |
| 2002/0064684 A1 | 5/2002 | Seo | |
| 2002/0097194 A1 | 7/2002 | Uchida et al. | |
| 2002/0119384 A1 | 8/2002 | Koyama et al. | |
| 2002/0121848 A1 | 9/2002 | Lee et al. | |
| 2002/0167270 A1 | 11/2002 | Siwinski et al. | |
| 2002/0190257 A1 | 12/2002 | Yamazaki et al. | |
| 2002/0191135 A1 | 12/2002 | Kim | |
| 2002/0195932 A1 | 12/2002 | Steckl et al. | |
| 2002/0196389 A1 | 12/2002 | Koyama | |
| 2003/0230972 A1 | 12/2003 | Cok | |
| 2004/0070633 A1 | 4/2004 | Nakamura et al. | |
| 2004/0113545 A1 | 6/2004 | Pang et al. | |
| 2004/0227159 A1 | 11/2004 | Nakashima et al. | |
| 2004/0239658 A1 | 12/2004 | Koyama et al. | |
| 2004/0245529 A1 | 12/2004 | Yamazaki et al. | |
| 2004/0263056 A1 | 12/2004 | Seo et al. | |
| 2004/0263425 A1 | 12/2004 | Anzai et al. | |
| 2005/0040753 A1 | 2/2005 | Osame et al. | |
| 2005/0151830 A1 | 7/2005 | Yamazaki | |
| 2006/0017380 A1* | 1/2006 | Fukunaga et al. | 313/506 |
| 2006/0139268 A1 | 6/2006 | Kobayashi | |
| 2007/0268271 A1 | 11/2007 | Kinjo | |

FOREIGN PATENT DOCUMENTS

| | | | |
|---|---|---|---|
| EP | 0880307 A2 | 11/1998 | |
| EP | 1071313 A1 | 1/2001 | |
| EP | 1119222 A2 | 7/2001 | |
| EP | 1191820 A1 | 3/2002 | |
| EP | 1227390 A2 | 7/2002 | |
| EP | 1 577 862 A1 | 9/2005 | |
| EP | 1 589 785 A1 | 10/2005 | |
| EP | 2 326 143 A2 | 5/2011 | |
| JP | 62-049897 U | 3/1987 | |
| JP | 03-092398 A | 9/1991 | |
| JP | 04-355786 A | 12/1992 | |
| JP | 06-013184 A | 1/1994 | |
| JP | 06-096858 A | 4/1994 | |
| JP | 06509654 A | 10/1994 | |
| JP | 07-220871 A | 8/1995 | |
| JP | 08-152619 A | 6/1996 | |
| JP | 09-180883 A | 7/1997 | |
| JP | 10-144475 A | 5/1998 | |
| JP | 10-162959 A | 6/1998 | |
| JP | 10-255976 A | 9/1998 | |
| JP | 10-289784 A | 10/1998 | |
| JP | 10-335061 A | 12/1998 | |
| JP | 11-045779 A | 2/1999 | |
| JP | 11502950 A | 3/1999 | |
| JP | 11-329753 A | 11/1999 | |
| JP | 2000-058260 A | 2/2000 | |
| JP | 2000-292777 A | 10/2000 | |
| JP | 2001022303 A | 1/2001 | |
| JP | 2001-109395 A | 4/2001 | |
| JP | 2001-312228 A | 11/2001 | |
| JP | 2001-319776 A | 11/2001 | |
| JP | 2001-332392 A | 11/2001 | |
| JP | 2001-345184 A | 12/2001 | |
| JP | 2001-356714 A | 12/2001 | |
| JP | 2002-149087 A | 5/2002 | |
| JP | 2002162652 A | 6/2002 | |
| JP | 2002-216975 A | 8/2002 | |
| JP | 2002-221911 A | 8/2002 | |
| JP | 2002-296063 A | 10/2002 | |
| JP | 2002287690 A | 10/2002 | |
| JP | 2002-373792 A | 12/2002 | |
| JP | 2003058081 A | 2/2003 | |
| JP | 3408154 A | 5/2003 | |
| JP | 2003-317959 A | 11/2003 | |
| JP | 2003-345271 A | 12/2003 | |
| JP | 2004-086014 A | 3/2004 | |
| JP | 5171773 B2 | 3/2013 | |
| WO | 9218964 A1 | 10/1992 | |
| WO | 9412963 A1 | 6/1994 | |
| WO | 9704398 A2 | 2/1997 | |
| WO | WO 02/056284 A1 | 7/2002 | |
| WO | WO 03/077231 A2 | 9/2003 | |
| WO | WO 2004/026001 A1 | 3/2004 | |

OTHER PUBLICATIONS

Exhibition of Active Matrix Type Organic EL Display at "13th Flat Panel Display Manufacturing Technology Expo & Conference" by ELDis Group (in Japanese with full translation); Jul. 2, 2003.

Documents distributed in the "13th Flat Panel Display Manufacturing Technology Expo & Conference" by ELDis Group (5 pages) w/English language translation.

"Two-way display developed"; The Japan Times; (1 page); Jul. 3, 2003.

"Mass Production of Organic EL Devices"; Shimotsuke Newspaper (in Japanese with full translation); Jul. 3, 2003.

International Search Report (Application No. PCT/JP2004/000204 in Japanese), Jun. 1, 2004, 3 pages.

Kwan Hee Lee et al.; "QCIF Full Color Transparent AMOLED Display"; 2003 SID International Symposium Digest of Technical Papers, vol. XXXIV, Book 1; pp. 104-107; May 2003.

Written Opinion (Application No. PCT/JP2004/000204 in Japanese With Partial Translation), Jun. 1, 2004, 9 pages.

European Search Report (Application No. 04702075.5), dated Dec. 28, 2007.

Office Action issued by the Chinese Patent Office on Mar. 28, 2008 for Application No. 200480007898.X, with an English translation (27 pages).

European Search Report issued on Jun. 9, 2011 in European Application No. 11000008.0, 8 pages.

Office Action, Chinese Application No. 201010004765.4, dated Aug. 15, 2011, 11 pages with English translation.

* cited by examiner

SEMICONDUCTOR DEVICE, AND ELECTRONIC BOOK INCLUDING DOUBLE-SIDED LIGHT EMITTING DISPLAY PANEL

CROSS-REFERENCE TO RELATED APPLICATIONS

This application is a continuation of U.S. application Ser. No. 11/695,110, filed Apr. 2, 2007, now U.S. Pat. No. 8,084,081, which is a divisional of U.S. application Ser. No. 10/760,716, filed Jan. 21, 2004, now U.S. Pat. No. 7,199,520, which claims the benefit of a foreign priority application filed in Japan as Serial No. 2003-016409 on Jan. 24, 2003, all of which are incorporated by reference.

TECHNICAL FIELD

The present invention relates to a light emitting device including a pixel portion including light emitting elements having a light emitting layer containing an electro luminescence (EL) material between a pair of electrodes.

BACKGROUND ART

Research on light emitting devices using an EL device as spontaneous light emitting element has been actively done. Such light emitting devices are also referred to as organic EL displays or organic light emitting diodes. Because of its features of high response speed, low voltage, and low-power-consumption drive suitable for displaying moving images, the light emitting devices attract considerable attention as next-generation displays including new-generation cellular phones and personal digital assistants (PDA).

EL devices using organic compound layers as light emitting layers have a structure in which a multilayer film is deposited on a substrate, the multilayer film including at least one layer made of an EL material (hereinafter, referred to as an EL layer) interposed between a pair of a anode and a cathode one of which has translucency and emits electroluminescence from the EL layer by adding an electrical field to the anode and the cathode. The light emission from EL devices includes light emission (fluorescence) at electron transition from an excited singlet state to a ground state and light emission (phosphorescence) at electron transition from an excited triplet state to a ground state.

In this specification, all layers provided between a cathode and an anode are collectively referred to as EL layers.

The EL layer has a layered structure typified by "a hole transport layer/a light emitting layer/an electron transport layer." EL materials for the EL layer are roughly classified into a low molecular (monomeric) material and a high molecular (polymeric) material.

Organic EL elements have a layered structure including an organic material between a pair of opposing electrodes and, in order to extract light generated from an EL layer, at least one of the anode and the cathode must be made of a translucent conductive material such as indium tin oxide (hereinafter, referred to as ITO). A typical organic EL element has a structure in which ITO deposited by sputtering is placed as anode on a substrate, on which an EL layer and a cathode made of metal such as aluminum are layered. With the organic EL element with such a structure, light is extracted from the anode formed on the substrate. When a display having the organic EL elements with such a structure as pixel is displayed by active matrix driving, TFTs on the substrate block off the light that has passed through the anode, significantly reducing light-emission efficiency. Accordingly, organic EL elements have been researched recently which are constructed such that a metal electrode having no translucency, on which an EL layer and a translucent conductive material are stacked. With the organic EL devices having such a structure, TFTs on the substrate do not block off light even if a display is displayed by active matrix driving.

DISCLOSURE OF THE INVENTION

Problems that the Invention is to Solve

The above-described typical organic EL elements having a structure in which light is extracted from both sides of a substrate are produced such that ITO deposited on the substrate by sputtering is used as anode, on which an organic EL layer and a metal thin film or ITO are stacked. The conventional organic EL elements with such a structure divide light emitted from the EL layer to both sides of the substrate. Luminescence relative to drive voltage is therefore about half of that of organic EL elements with a structure in which light is extracted from only one side.

Accordingly, a first problem is posed that it is difficult to extract high-luminance light from both of the negative and positive transparent electrodes with a low drive voltage.

When ITO is deposited on an EL layer by sputtering as a cathode, high drive voltage is required because the gap between the ionizing potential of the EL layer and the work function of the ITO is large, thus having low electron donating property from the ITO to the EL layer. In order to solve the problem, a metal thin film is interposed between the EL layer and the ITO or metal with a high electron donating property, such as alkali metal or alkaline earth metal, is added to part of the EL layer, thereby increasing the electron donating property from the ITO to the EL layer. Since the metal thin film or the added alkali metal or alkaline earth metal decreases the transmittance of the cathode, the luminance of the cathode is reduced significantly.

This poses a second problem that it is difficult to set the luminance of the anode and the cathode to the same level because of the difference in transmittance of the electrodes and also it is impossible to make only on one side emit light depending on the application.

In the process of sputtering ITO on the EL layer, when the EL layer is exposed to the atmosphere when the substrate is transferred from a vapor deposition unit to a sputtering unit in a state in which the EL layer has been formed on the substrate, the EL layer is easily oxidized by water and oxygen in the atmosphere. Particularly, alkali metal or alkaline earth metal added to improve electron donating property from the cathode to the EL layer is easily oxidized by oxygen in the atmosphere into an insulating material.

Accordingly, a third problem is produced that when the EL layer is exposed to the atmosphere in a state in which the EL layer has been formed on the substrate, the characteristic of the organic EL elements deteriorates significantly.

In the conventional art, when a light emitting device that uses organic EL elements as pixels is driven, which have a structure in which light is extracted from both sides of the cathode and the anode, one side displays an image and the other side displays a mirror image thereof.

This produces a fourth problem of inverting characters on either side thereof.

With the light emitting device of the type of extracting light from both sides of the substrate, a desiccating agent cannot be sealed in with a sealed can as in the conventional art. Even the case of sealing with two opposing glasses has the disadvantage of having so little space for a desiccating agent that it is difficult to use a sufficient amount of desiccating agent.

This poses a fifth problem of requiring a method for sealing with a small amount of desiccating agent or a method for sealing without using a desiccating agent.

Accordingly, in view of the above-described problems, the present invention is directed to a light emitting device capable of emitting light with low voltage, controlling the luminance of both sides independently, and displaying images on the both sides independently.

The present invention is also directed to a method for forming an ITO electrode without exposing an EL layer to the atmosphere and a method for sealing without using a sealed can or a desiccating agent.

Means for Solving the Problems

In order to solve the above problems, the present invention is directed to a light emitting device comprising a pixel portion arranged in matrix form over a substrate, wherein the pixel includes; a first light emitting element and a second light emitting element with a structure in which at least one organic layer is interposed between a pair of anode and a cathode at least one of which has translucency, wherein the first light emitting element emits light perpendicular to the surface of the substrate and only in a direction from the side of the substrate to the side formed with the pixel portion, and wherein the second light emitting element emits light perpendicular to the surface of the substrate and only in a direction opposite to the first light emitting element.

The use of the above-described means eliminates the use of a structure in which one organic EL device emits light on both sides. According, there is no need to apply high drive voltage to achieve high luminance on both sides of the pixel, capable of improving the durability of the entire light emitting device.

Since the both emitting sides are independently driven, the luminance of the opposite emitting sides can easily be made equal or only one surface can be made emit light according to purposes.

The present invention is also directed to a method for forming an ITO electrode without exposing an EL layer to the atmosphere in manufacturing the light emitting device by providing a vapor deposition chamber and a sputtering chamber to one vacuum deposition unit, in which the substrate is transferred from the vapor deposition chamber to the sputtering chamber via the transfer chamber.

Independent driving of the opposite light emitting surfaces solves the problem that one surface displays an image and the other surface displays its mirror image.

The sealing according to the invention is characterized in that a substrate having light emitting elements and a transparent opposing substrate are bonded together, wherein when the two substrates are bonded, the entire pixel region is covered with a transparent sealing material, the outer side of which is surrounded by another high-viscosity sealing member containing a gap material (a filler, fine particles, etc.) which holds the interval between the two substrates, thereby sealing the device with the two kinds of sealing materials so that no bubbles enter. Adopting such a sealing method allows a high-reliability light emitting device without using a sealed can or a desiccating agent.

Advantage of the Invention

According to the present invention, a thin lightweight light emitting device capable of double-sided display can be provided.

Particularly, conventionally, on a connection with space or cost a large subscreen can be mounted to portable digital assistants which could mount only a small subscreen, thus increasing the added value of portable digital assistants.

Mounting the display unit according to the present invention to electronic books and notebook computers allows versatile and convenient use.

BEST MODE FOR CARRY OUT THE INVENTION

Embodiment Modes of the present invention will be specifically described with reference to the drawings.

Embodiment Mode 1

Figure 1:
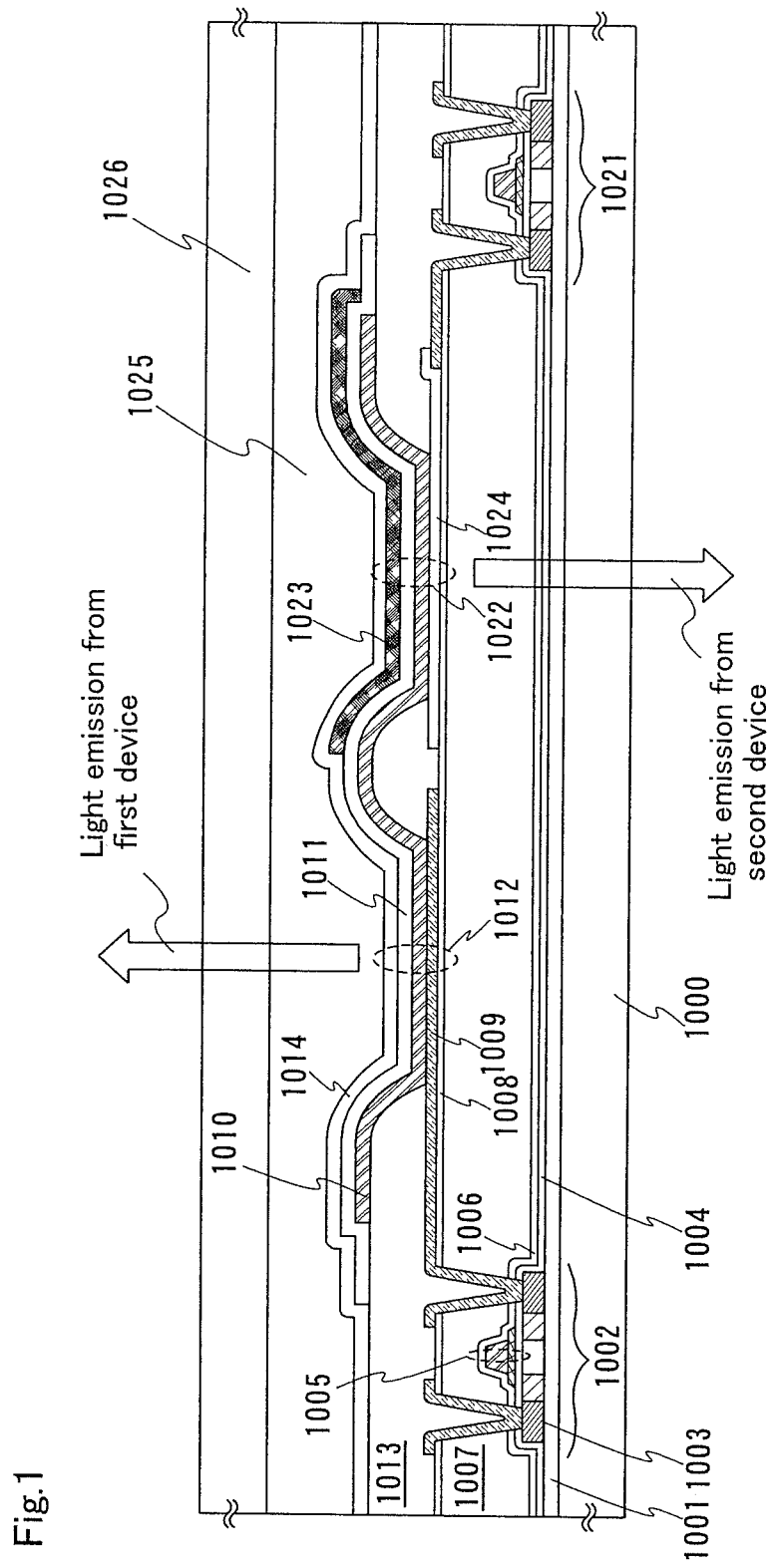
FIG. 1 is a cross sectional view of a light emitting device according to the present invention.

The structure of pixels and sealing and a method for manufacturing the same according to the present invention will be described herein below. The principal structure of the pixels of the present invention is shown in FIG. 1. Although an active matrix driving TFT is shown here, the driving system may be a simple matrix system.

The principal structure of the light emitting device of the invention is roughly classified into a first substrate, a first light emitting element and a TFT for driving it, a second light emitting element and a TFT for driving it, a transparent protective film, a sealing agent, and a second substrate. The first light emitting element emits light perpendicular to the surface of the substrate and only in a direction from the side of the substrate to the side having the pixel portion by using a first anode 1009 as reflecting electrode and a cathode 1011 as transparent electrode. The second light emitting element emits light perpendicular to the surface of the substrate and only in a direction opposite to the first light emitting element with regarding a second anode 1024 as transparent electrode and regarding a second cathode 1023 as reflecting electrode. Hereinafter, the direction of light emitted from the first light emitting element is expressed as upward and an opposite direction thereof is expressed as downward.

It is desirable that a first substrate 1000 be made of a material having high smoothness and high transmittance in a visible region, such as glass or plastic. A ground film 1001 acts to insulate the substrate and a TFT electrically from each other, blocks off contaminant generated from the substrate from the TFT and an EL layer, and reduces the unevenness of a substrate surface.

The ground film 1001 has a first driving TFT 1002 and a second driving TFT 1021 formed thereon. The first driving TFT 1002 includes an active layer 1003, a gate electrode 1005, and a gate insulating film 1004 interposed between the active layer 1003 and the gate electrode 1005.

The first driving TFT 1002 is coated with a first interlayer insulating film 1006, on which a second interlayer insulating film 1007 and a third interlayer insulating film 1008 are formed.

The first driving TFT 1002 and the second driving TFT 1021 have the same structure.

The first anode 1009 is an anode of the first light emitting element and the second anode 1024 is an anode of the second light emitting element. Numeral 1010 denotes an EL layer, and numeral 1011 denotes a cathode. The part where the first anode 1009, the EL layer 1010, and the cathode 1011 overlap corresponds to a first light emitting element 1012. The part where the second anode 1024, the EL layer 1010, and the cathode 1011 overlap corresponds to a second light emitting element 1022. The first driving TFT 1002 controls the current supplied to the first light emitting element 1012 and connects electrically to the first light emitting element 1012 directly or via another device. The second driving TFT 1021 controls the current supplied to the second light emitting element 1022 and connects electrically to the second light emitting element 1022 directly or via another device.

For the first anode 1009, a material with high hole injection efficiency is suitable, preferably, a material having a high work function, such as Ti, TiN, $TiSi_xN_y$, Ni, W, $WSi_x$, $WN_x$, $WSi_xN_y$, NbN, Mo, Cr, Pt, Se, Pd, Ir, Au, and their mixtures or alloys. Other metal electrodes can exhibit sufficient hole injection efficiency by depositing ITO thereon.

The second anode 1024 has only to be made of a material that acts as transparent electrode, preferably, ITO.

The first anode 1009 and the second anode 1024 can be formed by deposition with a sputtering unit and then patterning them with a dry etching unit.

An organic resin film 1013 prevents the formed EL layer 1010 and the cathode 1011 from being separated by the steps at the ends of the first anode 1009 and the second anode 1024. The organic resin film 1013 is desirably made of, for example, an acrylic resin or polyimide and, particularly, a photosensitive acrylic resin for micro fabrication. The photosensitive acrylic resin is round in cross section after hardening and has the advantage of being hardly broken even if an ultrathin layer of about 1 to 10 nm in thickness is formed thereon. The photosensitive acrylic resin is formed by using a spin coater, an aligner, or a processing machine, the thickness of which is controlled depending on the rotation speed and time of the spin coater.

The EL layer 1010 is produced by using a unit different from that for manufacturing the substrate. The EL layer 1010 is formed with a vacuum deposition unit when the organic material therefor is low-molecular-weight, while when it is polymeric, it is formed with a spin coater or an inkjet unit. For example, when 20 nm of CuPc, 30 nm of α-NPD, and 50 nm of $Alq_3$ are deposited using a vacuum deposition unit, a green-emitting organic EL element can be formed. CuPc is for an electron injection layer, α-NPD is for an electron transport layer, and $Alq_3$ is for a light emitting layer. The pressure in the vapor deposition chamber of this process is preferably of the order of $10^{-7}$ Pa to $10^{-4}$ Pa. This is because high pressure causes organic materials to be oxidized by remaining oxygen and heat during a vapor deposition process. The rate of deposition is preferably from about 0.1 to 0.2 nm/s. This is because a high deposition rate may decompose organic molecules.

The cathode 1101 is formed by sputtering ITO, for example. At that time, when the organic material in the EL layer is exposed to the atmosphere, it reacts easily with water or oxygen to cause degradation of the performance as EL element. Accordingly, it is preferable to use a unit with a structure in which a vapor deposition chamber and a sputtering chamber are connected with each other via a vacuum chamber isolated from outside air. The use of such a unit allows a series of all the processes from vapor deposition to sputtering, including the process of carrying the substrate, to be carried out in a vacuum, influences of water and oxygen in the atmosphere can be eliminated.

Forming ITO directly on an organic EL layer will extremely increase drive voltage because of low electron injection efficiency from the ITO to the EL layer. This requires a device for increasing the electron injection efficiency from the ITO to the EL layer.

For example, there is provided a method of adding a material having a high electron donating property such as alkali metal or alkaline earth metal, to the EL layer in the vicinity of the interface with the ITO by codeposition. Particularly, a method of adding Li to $Alq_3$ and a method of providing a Li-added BCP or CuPc layer on an $Alq_3$ layer are effective. Providing a property close to an N-type semiconductor to the organic material in the vicinity of the cathode in the EL layer with such means can remarkably increase electron injection efficiency from the ITO to the EL layer. Since the alkali metal and alkaline earth metal are easily oxidized in the atmosphere into an insulating material, it is preferable to avoid exposure to the atmosphere with the above-described devices.

Another method is provided in which a metal thin film is interposed between the EL layer and the ITO to increase electron injection efficiency from the ITO to the EL layer. For example, approximately 10 nm of an Al—Li alloy or a Mg—Ag alloy has translucency, thus having high electron injection performance from the ITO to the EL layer.

Since plasma generated in a sputtering chamber damages the EL layer during the process of depositing ITO in the sputtering chamber, the luminance characteristic of the organic EL element may be decreased. In order to minimize the damage, there are provided a method of controlling the conditions of sputtering (pressure, gas flow ratio, and making power) to decrease the concentration of plasma, a method of covering a target with mesh so as to prevent plasma from coming in contact with the substrate, and a method of providing an inorganic protection layer on the EL layer. In general, when deposition is carried out with reduced discharge power during sputtering, damage to the EL layer will be reduced but the relative resistance of ITO formed at low power shows a tendency to increase. Thus the pressure and gas flow ratio must be controlled to the optimum conditions in low-power deposition so that the relative resistance of the ITO becomes the minimum. For example, for deposition at RF 100 W or less, it is preferable to set the gas flow ratio $O_2$/Ar to zero and total pressure to approximately 1 Pa. General sputtering units can deposit ITO with a relative resistance of the order of μΩcm under the conditions. It is also preferable not only to optimize the deposition parameters but also to use a method of using a structure in which a target is covered with a mesh so that plasma generates only in an area between the target and the mesh, thereby preventing the plasma from coming in contact with the substrate (remote plasma sputtering) or a method of providing an inorganic protection layer on the EL layer, for example, a thin film made of metal, metal nitride, or metal boride.

The ITO electrode needs to satisfy all of low sheet resistance (10 to 100 Ω/sq) sufficient for electrode and high light transmittance (80 to 90% or more in a visible region) and preferable optical characteristics that do not weaken visible light due to interference.

Figure 2:
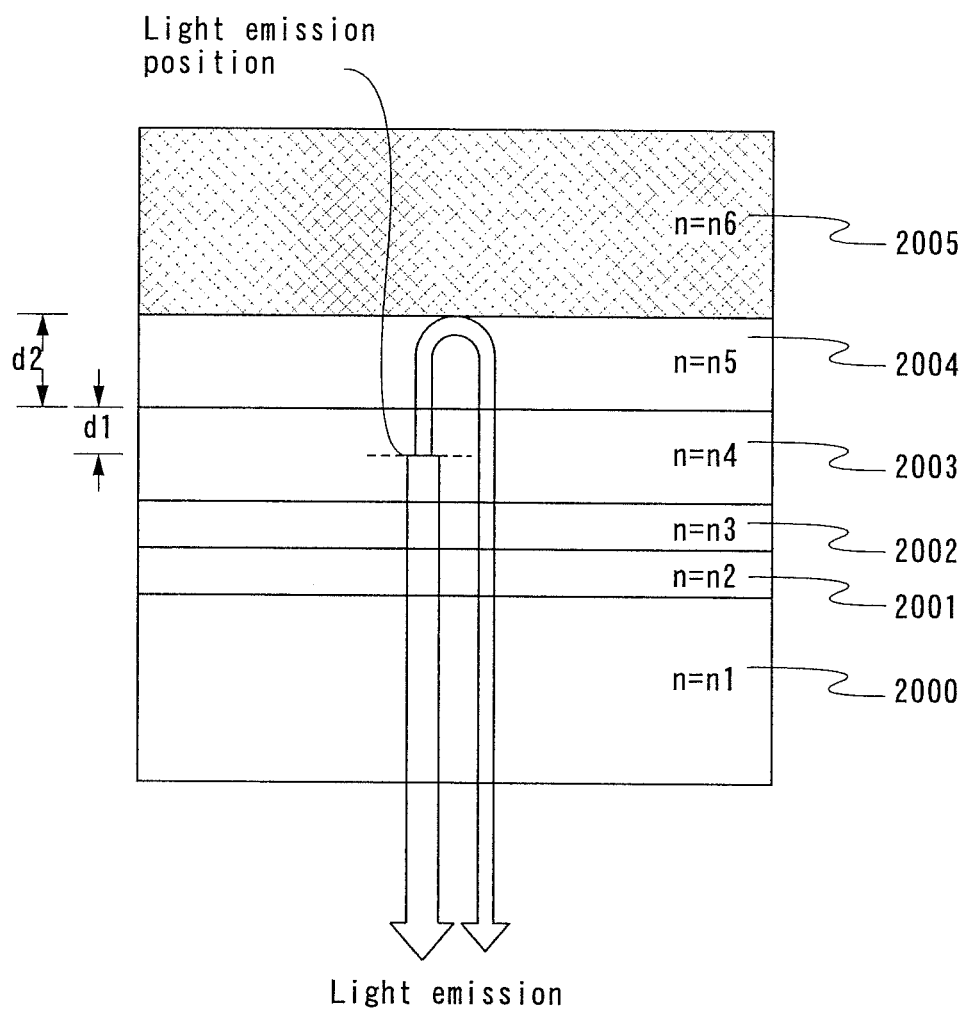
FIG. 2 is a diagram of the optical interference of light emission according to the present invention.

Particularly, since optical characteristics heavily depend on the film thickness of ITO electrodes, optimization is absolutely necessary. FIG. 2 is an enlarged view of principal parts of the second light emitting element in FIG. 1, showing the optical interference of the light emitting element with a structure in which a cathode (transparent electrode) 2004 and a second cathode (reflecting electrode) 2005 are deposited on an El layer having a hole injection layer 2001, a hole transport layer 2002, and a light emitting layer+an additive 2003. Let the refractive indexes of the cathode (transparent electrode) 2004 and the second cathode (reflecting electrode) 2005 be $n_4$ and $n_5$, respectively. The optical path difference of light (direct light) that reaches directly to the exterior from the light emitting layer+an additive 2003 and light (reflection light) that emerges from the light emitting layer+an additive 2003, passes through the cathode (transparent electrode) 2004 and is reflected by the interface with the second cathode (reflecting electrode) 2005 to reach the exterior is expressed as $2\times(n_4\times d_1+n_5\times d_2)$. A point to notice here is that, with $n_4>n_5$, since emitted light reflects at a free end, no phase change occurs at the reflecting portion; however, with $n_4<n_5$, since emitted light reflects at a fixed end, the phase changes by π at the reflecting portion. For example, with the lamination of ITO and Al, emitted light reflects at a free end. Accordingly, when the light emitting element is formed so that the optical path difference $2\times(n_4\times d_1+n_5\times d_2)$ is an integer multiple of a visible light wavelength λ, the light with a wavelength λ is intensified by interference. Reference numeral 2000 is an anode (transparent electrode).

The second cathode 1023 of FIG. 1 is formed such that the second light emitting element 1022 is completely covered and the first light emitting element 1012 is entirely not covered. The second cathode 1023 is preferably made of high-reflectivity metal, such as Al. Since Al transmits light with a thickness of about 10 nm, it is preferable to have a thickness of about 100 nm. Al can easily be deposited by either vapor deposition or sputtering.

Deposition of a transparent protection layer 1014 is directed to protecting the electrodes and the EL layer from water and oxygen. Accordingly it is preferable to form the transparent protection layer 1014 of a material insoluble in water into a shape that covers the cathode completely. It is preferable to use $CaF_2$, $BaF_2$, $MgF_2$, etc. They can easily be formed into a film by vapor deposition. Since the protection effect is larger as the thickness increases, it is preferable to set the thickness at 100 nm or more.

A sealing agent 1025 is applied so as to fill the space between the transparent protection layer 1014 and a second substrate 1026 completely. Sealing is performed in such a way that the first substrate 1000 having light emitting elements and the opposing second substrate 1026 are bonded together, wherein when the two substrates are bonded, the pixel region is completely covered with a transparent sealing material, whose outer surface is covered with another high-viscosity sealing member containing a gap material (a filler, fine particles, etc.) for holding the interval between the two substrates, thereby preventing inclusion of bubbles etc. by using the two kinds of sealing materials. For the patterning of the sealing agent, a dispenser is used. If even a little amount of water is trapped when the pair of substrates is bonded, the durability of a formed EL device is significantly affected. Therefore, it is desirable to put a sealing chamber under a reduced pressure or into a nitride atmosphere. The lower the dew point of the sealing chamber is the more preferable, preferably, −80° C. or less.

When an ultraviolet curable resin is used for the sealing agent, it is preferable to construct the transparent protection layer 1014 in two layers, the upper layer of which absorbs or reflects only ultraviolet rays, such as a ZnO layer.

In the embodiment, all the processes of forming an organic layer, the transparent electrode, and the transparent protective film can be carried out under a pressure of $1\times10^{-3}$ Pa or less.

Embodiment Mode 2

Figure 11:
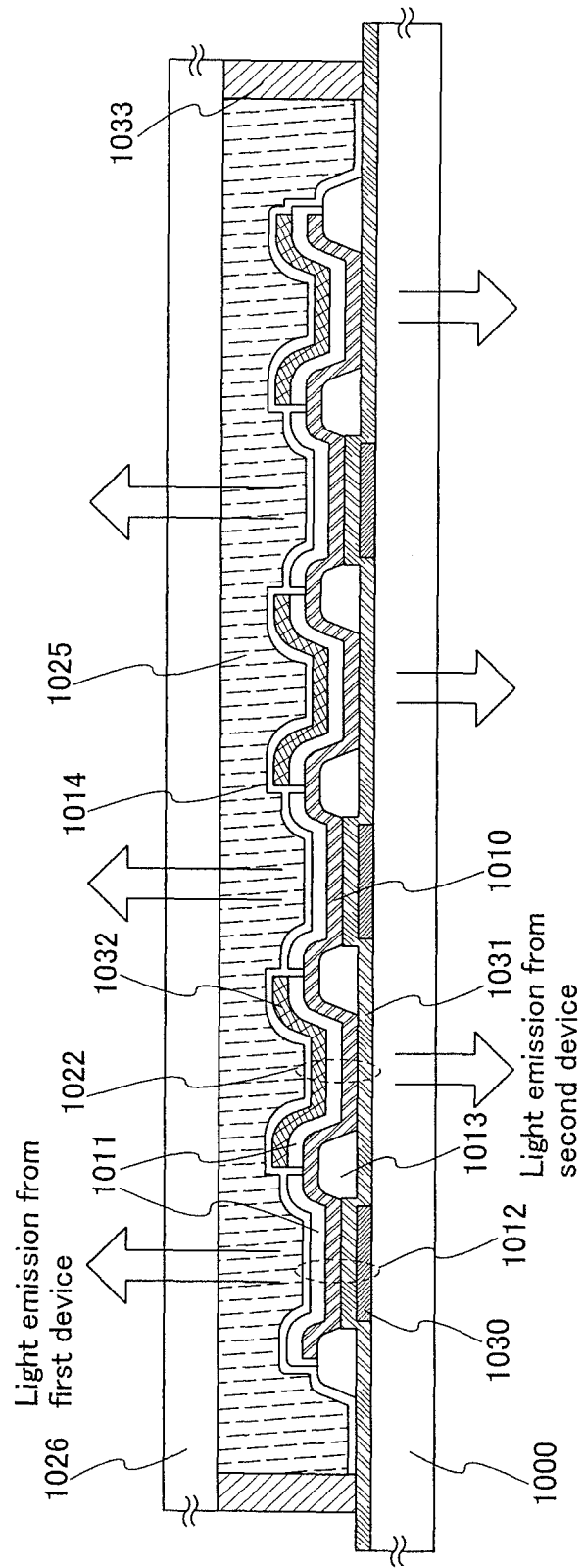
FIG. 11 is a cross sectional view of a light emitting device according to the present invention.

FIG. 11 shows the principal structure of the pixels of the present invention. Here the structure of a simple matrix light emitting device is shown. In this embodiment, the same components as those of the embodiment mode 1 are described with reference to the same numerals.

The light emitting device according to the embodiment is constructed such that the first light emitting element 1012 and the second light emitting element 1022 are provided between the first substrate 1000 and the second substrate 1026, and the substrates are fixed together with a space therebetween with an adhesive 1033 containing spacers. An anode 1031 and the positive 1011 are transparent electrodes. The first light emitting element 1012 has a light-shielding film 1030 on the side of the anode 1031, while the second light emitting element 1022 has a light-shielding film 1032 on the side of the cathode 1011, respectively, thereby setting the direction of emitting light.

In the simple matrix system, the anode 1031 and the cathode 1011 are formed in stripes, the intersection of which is provided with an EL layer, to form pixels in matrix form. The structure shown in FIG. 11 has the EL layer 1010 between the anode 1031 and the cathode 1011 and the first light emitting element 1012 emits light from the first substrate 1000 and the second light emitting element 1022 emits light from the second substrate.

The anode 1031 may be a transparent electrode made of ITO or containing $SiO_2$ of 1 to 10 weight percent, e.g., 5 weight percent, to increase the flatness. The cathode 1011 contains alkali metal or alkaline earth metal, as a material having a high electron-donating property, added to the EL layer in the vicinity of the interface with the ITO by codeposition. Another method may be provided which improves electron injection efficiency from the ITO to the EL layer by placing a metal thin film between the EL layer and the ITO.

The light-shielding films 1030 and 1032 can be formed of Al, Ti, Mo, or another metal or nontranslucent resin materials containing pigment.

The transparent protection layer 1014 is formed in a shape that covers the cathode completely and preferably made of $CaF_2$, $BaF_2$, $MgF_2$, etc. They can easily be formed by vapor deposition. Since the protection effect is larger as the thickness increases, it is preferable to set the thickness at 100 nm or more. In addition, a silicon nitride film formed from a silicon target by high-frequency sputtering may be used.

The sealing agent 1025 is applied so as to fill the space between the transparent protection layer 1014 and the second substrate 1026. The sealing agent 1025 is desirably made of a light curable resin and has high translucency for the light emitted from the first light emitting element 1012.

Although not shown, colored layers may be provided between the first light emitting element 1012 and the second substrate 1026 and between the second light emitting element 1022 and the first substrate 1000 to allow transmission of light with a specified wavelength of the light emitted from the light emitting elements. In other words, the color purity of the emitted light can be increased and multicolor display can be performed.

Since the anode 1031 and the cathode 1011 are separately formed and independently controlled, even if it adopts a simple matrix, it is possible to provide a light emitting element capable of emitting light at low voltage, independently controlling the luminance on the opposite sides, and independently displaying images on the opposite sides.

Embodiment Mode 3

A method for driving the light emitting device according to the embodiment mode 1 of the invention will now be described with reference to the following embodiment mode 3.

Figure 3:
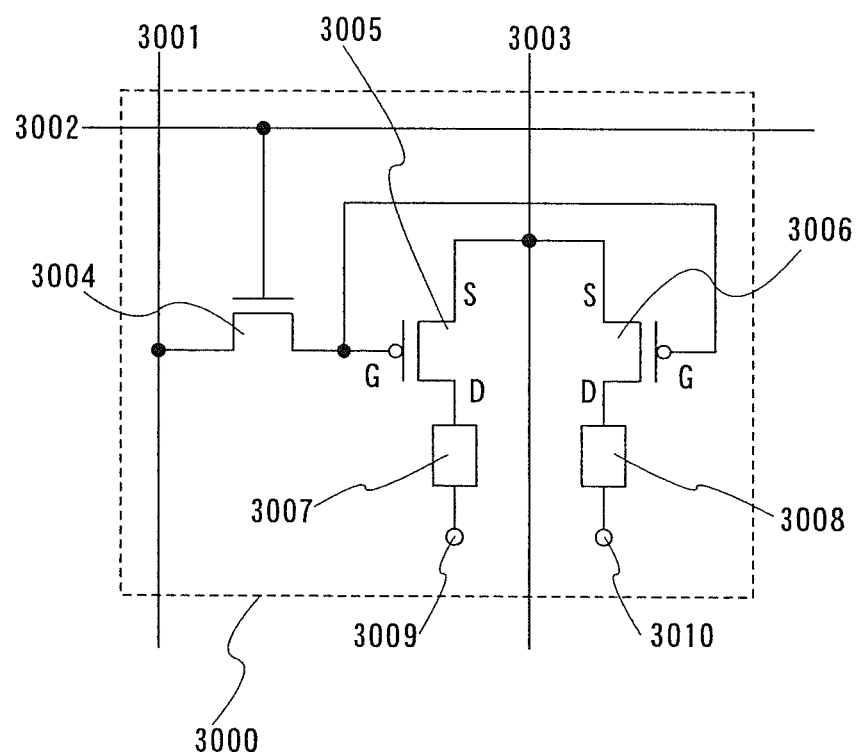
FIG. 3 is a diagram of a circuit configuration of the display device according to the present invention.

An embodiment of the invention is shown in FIG. 3. Although thin-film transistors (TFTs) are used here as switching elements and driving elements, they are not particularly limited to those. For example, MOS transistors, organic transistors, molecular transistors, etc. may be used similarly. Since the TFTs cannot be classified between a source region and a drain region depending on the structure and their operating conditions, one is expressed as a first electrode and the other as a second electrode.

Referring to FIG. 3, the region surrounded by a dotted-line frame 3000 forms one pixel and has a source signal line 3001, a gate signal line 3002, a current supply line 3003, a switching TFT 3004, a first driving TFT 3005, a second driving TFT 3006, a first light emitting element 3007, and a second light emitting element 3008. In each pixel, the region where light emitted from the first light emitting element 3007 is obtained is a first region, while a region where light emitted from the second light emitting element 3008 is obtained is a second region, both of which are contained in one pixel.

The gate electrode of the switching TFT 3004 is electrically connected to the gate signal line 3002. The first electrode is electrically connected to the source signal line 3001, while the second electrode is electrically connected to the gate electrodes of the first driving TFTs 3005 and 3006. The first electrode of the first driving TFT 3005 is electrically connected to the current supply line 3003. The second electrode is electrically connected to the first electrode of the first light emitting element 3007. The first electrode of the second driving TFT 3006 is electrically connected to the current supply line 3003. The second electrode is electrically connected to the first electrode of the second light emitting element 3008. The second electrode of the first light emitting element 3007 and the second electrode of the second light emitting element 3008 are electrically connected to the opposing electrodes 3009 and 3010 having potential difference with respect to the current supply line, respectively.

A video signal outputted to the source signal line 3001 is inputted to the gate electrodes of the first and second driving TFTs 3005 and 3006 at timing when the switching TFT 3004 is turned on. In accordance with the video signal, the first and second light emitting elements 3007 and 3008 are supplied with current, thereby emitting light. As described above, the first region and the second region can obtain the emitted light from the surface and the back of the substrate, respectively.

Figure 4:
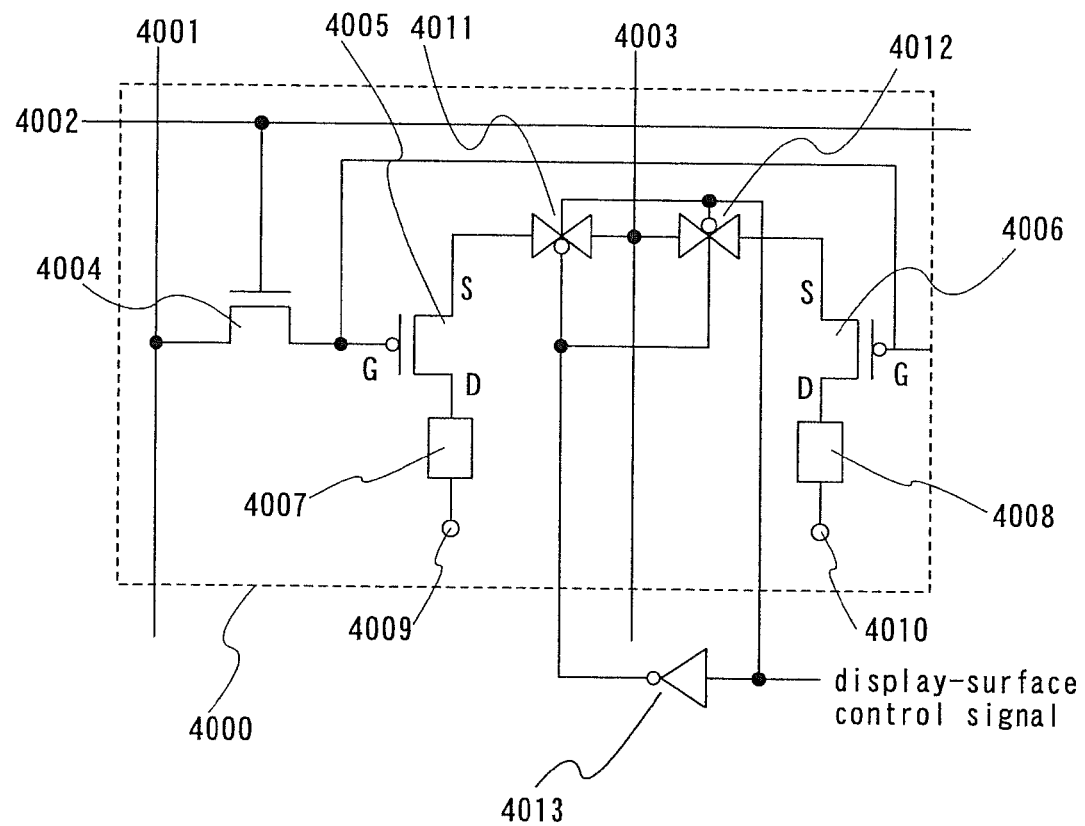
FIG. 4 is a diagram of a circuit configuration of the display device according to the present invention.

With such a structure, the emission and nonemission of the first light emitting element 3007 and the second light emitting element 3008 are controlled by the first and second driving TFTs 3005 and 3006. However, as shown in FIG. 4 for example, when analog switches 4011 and 4012, which operate exclusively, are provided between a current supply line 4003 and the first electrodes of first and second driving TFTs 4005 and 4006, respectively, and are controlled between ON and OFF in accordance with a display-surface control signal, the analog switch 4011 is turned on during a certain period to supply current to a first light emitting element 4007, thereby displaying a picture in the first region. On the other hand, the analog switch 4012 which operates exclusively with respect to the analog switch 4011 is in OFF state at that time to block off a current supply pass to a second light emitting element 4008, so that the second region emits no light. In contrast, in the period when the analog switch 4012 is turned on to supply current to the second light emitting element 4008, thereby displaying a picture in the second region, the analog switch 4012 is turned off to block off a current supply path to the first light emitting element 4007, so that the first region emits no light. At that time, a display-surface control signal may be outputted by some operation of a user to switch a display surface or, alternatively, may be automatically switched depending on the state of use (for example, whether the terminal is folded or opened). Reference numeral 4000 is a pixel, reference numeral 4001 is a source signal line, reference numeral 4002 is a gate signal line, reference numeral 4004 is a switching TFT, reference numerals 4009 and 4010 are the opposing electrodes, and reference numeral 4013 is an inverter.

Figure 5:
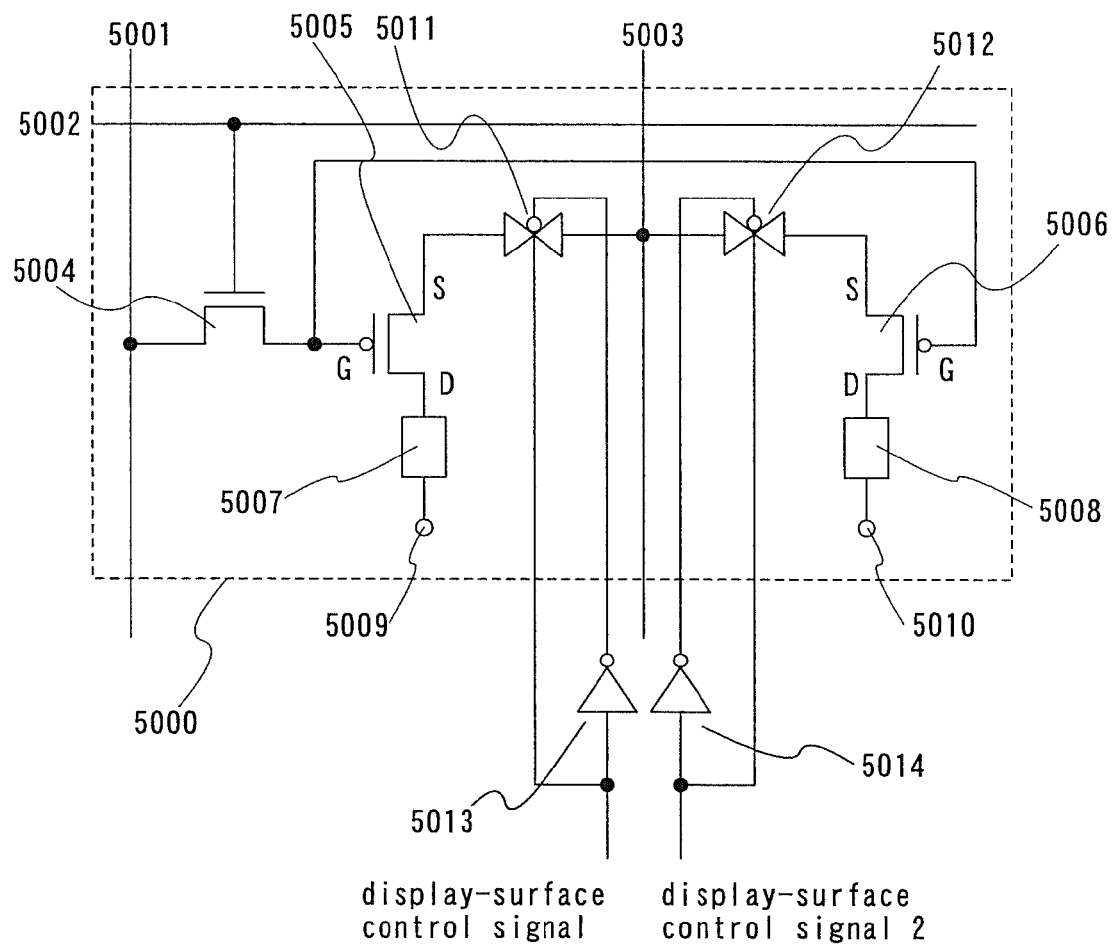
FIG. 5 is a diagram of a circuit configuration of the display unit according to the present invention.

The analog switches 4011 and 4012 may not be exclusively operated but may be independently controlled with a display-surface control signal 1 and a display-surface control signal 2, as shown in FIG. 5. With such a structure, both of the first region and the second region may be freely switched between display and non-display. Reference numeral 5000 is a pixel, reference numeral 5001 is a source signal line, reference numeral 5002 is a gate signal line, reference numeral 5004 is a switching TFT, reference numeral 5005 is a first driving TFT, reference numeral 5006 is a second driving TFT, reference numeral 5007 is a first light emitting element, reference numeral 5008 is a second light emitting element, reference numerals 5009 and 5010 are the opposing electrodes, reference numeral 5013 is an inverter.

A method for displaying different pictures in the first region and the second region by using the structures shown in FIGS. 4 and 5 includes a method in which, for example, in a one-frame period, display for the first region is performed in odd frames and display for the second region is performed in even frames. At that time, the display-surface control signal has only to be inverted every one frame period so that analog switches 5011 and 5012 can be switched between ON and OFF.

The invention with such a structure will be specifically described with reference to the following embodiments.

EMBODIMENTS

Embodiment 1

In this embodiment, a multichamber-system manufacturing apparatus and method manufacturing for the purpose of forming a light emitting device will be described. The multichamber manufacturing unit inputs a substrate that is previously provided with an insulating material etc. for covering a thin-film transistor, an anode (first electrode), and the end of the anode to perform processes such as deposition continuously, and then integrates it with another opposing substrate to seal them, thereby constructing a panel.

Figure 6:
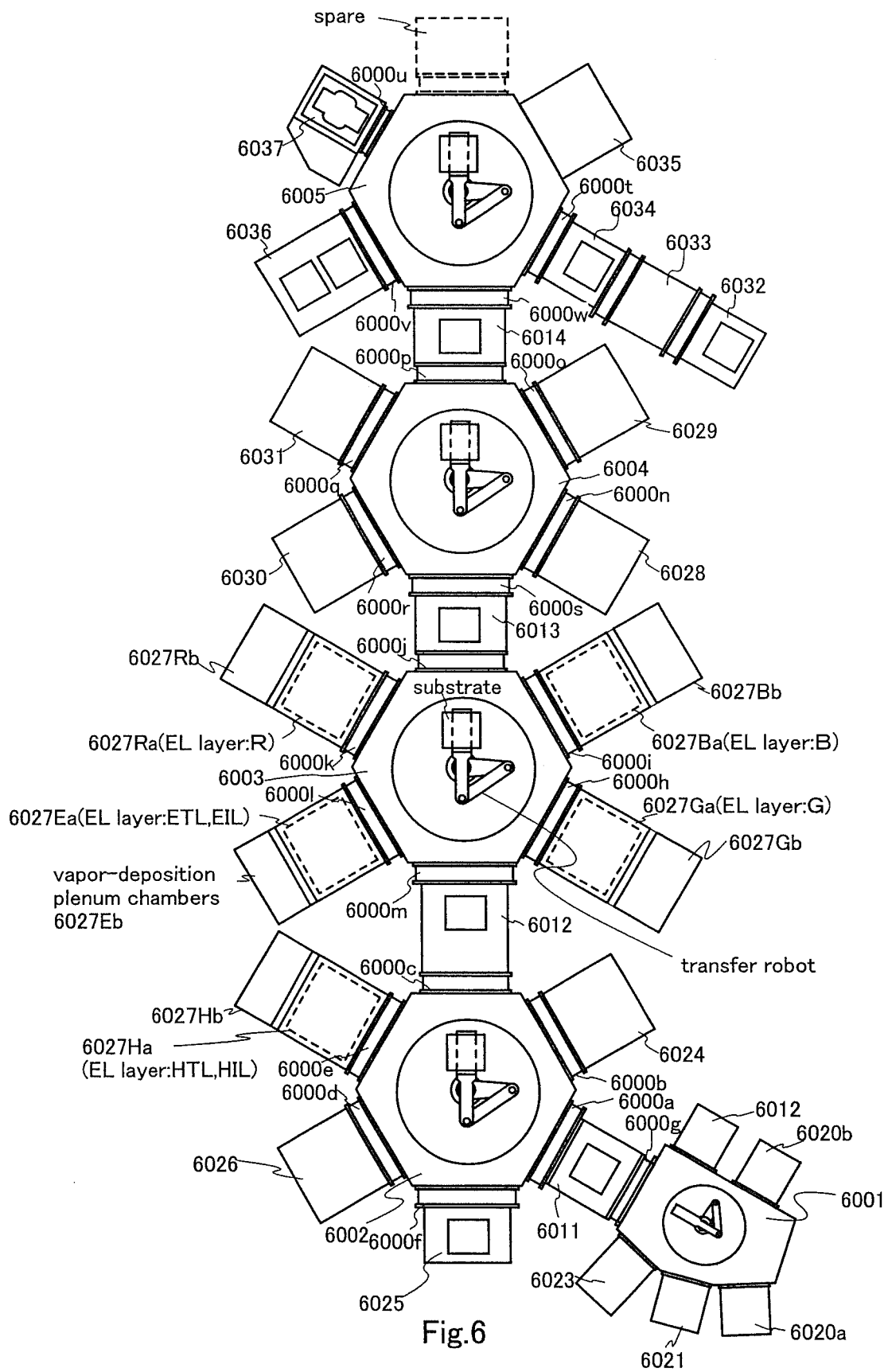
FIG. 6 is a diagram of Embodiment 1 of the present invention.

FIG. 6 shows a multichamber-system manufacturing unit including gates 6000a to 6000w, transfer chambers 6001, 6002, 6003, 6004, and 6005 (each including a transfer robot for transferring a substrate), a treatment chamber 6011, delivery chambers 6012, 6013, and 6014, cassette chambers 6020a and 6020b, a tray mounting stage 6021, a deposition chamber 6022, a substrate heating chamber 6023, a substrate-mask stock chamber 6024, a preprocess chamber 6025, a substrate heating chamber 6026, vapor deposition chambers 6027Ha, 6027Ra, 6027Ga, 6027Ba, 6027Ga, and 6027Ea, vapor-deposition plenum chambers 6027Hb, 6027Rb, 6027Gb, 6027Bb, and 6027Eb, vapor deposition chambers 6028 and 6029, sputtering chambers 6030 and 6031, opposing-glass $N_2$ displacement chamber 6032, a glove box 6033, a preparation chamber 6034, a substrate/opposing-substrate stock chamber 6035, a sealing chamber 6036, and an extraction chamber 6037.

A method for inputting a substrate into the manufacturing unit will now be described.

A cassette including a substrate is inputted in the cassette chamber 6020a or the cassette chamber 6020b. The manufacturing unit is characterized in that substrates of two sizes can be treated. When the substrate treated is a large one (300 mm×360 mm in this embodiment), a maximum of two large cassettes (each containing 12 stages) having large substrates can be inputted in the cassette chamber 6020a. When the substrate treated is a small one (126.6 mm×126.6 mm in this embodiment), a small cassette (containing 20 stages, of which upper 16 stages accommodate a small substrate and lower 4 stages are used as a space for the arm of the transfer robot in the transfer chamber 6001 to insert in this embodiment) having small substrates is inputted in the cassette chamber 6020a, and a tray cassette (containing four stages in this embodiment) including a substrate tray (300 mm×360 mm in this embodiment, the same as the large substrate) for mounting and transferring multiple small substrates is inputted into the cassette chamber 6020b. Thus, the cassette chamber 6020b can mount both a large cassette and a tray cassette. Both of the large substrate and the small substrate are placed face up at the time of input (the surface on which a film is grown in the post process is placed up). As apparent from the above, in this embodiment, the maximum number of substrates that can be inputted at a time, i.e. the maximum number of substrates per lot is 24 for the large substrate and 32 for the small substrate.

A method for inputting a metal mask into the manufacturing unit will be described.

Figure 7:
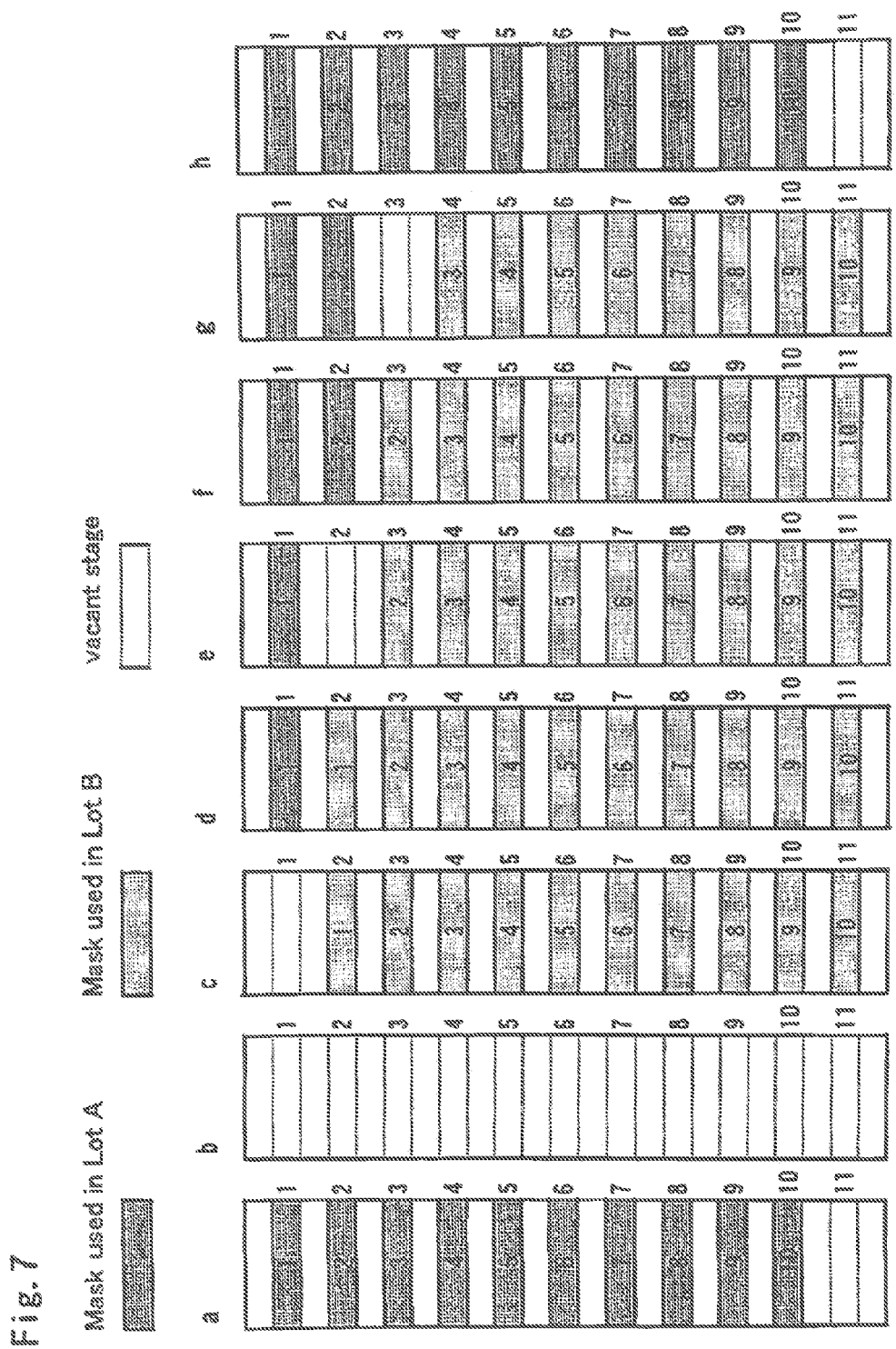
FIG. 7 is a diagram of Embodiment 1 of the present invention.

A total of 10 metal masks are set in the substrate-mask stock chamber 6024, the metal masks being used in the preprocess chamber 6025, the vapor deposition chambers 6027Ha, 6027Ra, 6027Ba, 6027Ga, and 6027Ea, the vapor deposition chambers 6028 and 6029, and the sputtering chambers 6030 and 6031. In the embodiment, the substrate-mask stock chamber 6024 has all-stage elevator structure. The state after the masks have been set is shown in FIG. 7a. After completion of the exhaust of the substrate-mask stock chamber 6024, necessary masks can be transferred to respective processing chambers. The state after the masks have been transferred is shown in FIG. 7b. The stages are used both for masks and substrates. Since all the stages of the chamber become vacant after the masks have been transferred to the chambers, the substrate-mask stock chamber 6024 can be used as a temporary substrate stock space, as described later.

The reason why the number of stages of the substrate-mask stock chamber 6024 is set one stage larger than the maximum mask count is that different kind of ten masks to be used in the next lot B can be prepared after completion of lot A and before masks used in the lot A are collected, as shown in FIG. 7c. More specifically, the process of: collecting masks that was used in lot A→transferring masks to be used in lot B, can be performed continuously using a vacant one stage for each processing chamber for a mask, as in order of FIG. 7d→FIG. 7e→FIG. 7f→FIG. 7g . . . . Accordingly, the masks can be exchanged for all chambers for masks finally, as shown in FIG. 7h. This allows reduction in working hours for exchanging masks.

A method for inputting an opposing substrate into the manufacturing unit will then be described.

When the substrate is large (300×360 mm), a large opposing substrate of the same size as that of the substrate is accommodated in the same large cassette (12 stages) as that used in the cassette chamber 6020b, and at most two cassettes are set in the opposing-glass $N_2$ displacement chamber (i.e. the number of large opposing substrates that can be inputted is at most 24). When the substrate is small (126.6 mm×126.6 mm), an opposing tray (300×360 mm in this embodiment) that can mount a plurality of (four in this embodiment) small opposing substrates one size smaller than the substrate (122.6 mm×122.6 mm, which is smaller than the substrate by an amount corresponding to the outer periphery 2 mm in this embodiment) is accommodated in the same tray cassette as that used in the cassette chamber 6020b, and at most two cassettes, are placed in the opposing-glass $N_2$ displacement chamber 6032 (i.e. the number of small opposing substrates that can be inputted is at most 32). Both of the large opposing substrate and the small opposing substrate are placed face up at the time of input and the subsequent processes (the surface in contact with the substrate when bonded to the substrate is placed up).

A method for processing the substrates will be described in sequence.

The transfer chamber 6001 is constantly under a $N_2$ atmosphere pressure, in which a transfer robot (having a substrate vacuum mechanism) mounted therein collects a substrate. For a large substrate, the robot takes the substrate out from the cassette chamber 6020b and transfers it to the treatment chamber 6011. For a small substrate, the robot takes a tray out from the cassette chamber 6020b, transfers it to the tray mounting stage 6021, and then takes a small substrate out from the cassette chamber 6020a and transfers it to the tray mounting stage 6021, and then mounts it onto the tray (at most four in this embodiment). Thereafter, the tray having the large substrate or the small substrate is carried into the treatment chamber 6011. From then on, the substrate is placed face down (the surface on which a film is formed in the post process is placed down).

Accordingly, with the manufacturing unit, four small substrates are processed at the same time, thus providing significantly high throughput for the small substrate. Only a process for a large substrate will be described hereinafter, unless otherwise specified, and the large substrate is simply referred to as a substrate. However, the process for the small substrate is exactly the same.

The treatment chamber 6011 is connected to the transfer chamber 6002 which is constantly maintained under a vacuum. Accordingly, after the substrate has been carried to the treatment chamber 6011, the substrate is carried therefrom into the transfer chamber 6002 after evacuation thereof. After carrying out the substrate, an inert gas is introduced into the treatment chamber 6011 to return it to the atmospheric pressure (vent), thus preparing the subsequent carrying-in of the substrate flowing from the transfer chamber 6001.

Processing-chamber vacuum pumps capable of evacuation of the transfer chamber 6001 etc. are provided, such as a magnetic-levitation turbo-molecular pump, a cryopump, or an oilless pump. This allows the target vacuum to set at $10^{-5}$ to $10^{-6}$ Pa and also allows control of the back diffusion of impurities from the pump and an exhaust system. In order to prevent impurities from entering the interior of the unit, an inert gas such as nitrogen or rare gas is introduced. The gas to be introduced into the unit is highly purified by a gas purification unit before introduction to the unit. Accordingly, a gas purification unit must be prepared in order to introduce highly purified gas into a vapor deposition unit. This allows oxygen, water, and other impurities contained in the gas to be removed in advance, thus preventing introduction of the impurities into the unit.

Sometimes a shrink phenomenon occurs in a finished light emitting element in which luminance decreases from the periphery of display pixels. One of prevention measures is vacuum heating directly before the vapor deposition of a film containing an organic compound. This can be carried out by a heater (a sheath heater etc.) provided in the preprocess chamber 6025 or the substrate heating chamber 6026. In order to completely remove water and other gases contained in the substrate, annealing for degassing is carried out in a vacuum ($5 \times 10^{-3}$ torr (0.665 Pa) or less, preferably, $10^{-4}$ to $10^{-6}$ Pa). Particularly, when organic resin films are used as the materials of an interlayer insulating film and a partition film, some organic resin materials may absorb water and cause degassing. Therefore, it is effective to carry out vacuum heating, before forming layers containing the organic compounds, to heat them at 100° C. to 250° C., preferably, 150° C. to 200° C., for 30 minutes or more and then carry out self-cooling for 30 minutes, thereby removing absorbed water.

However, since necessary heating and cooling times are long, throughput is extremely decreased in continuously transferring the substrates. The substrate heating chamber 6026 has therefore multiple stages. In this embodiment, the number of substrates heated in the preprocess chamber 6025 at a time is at most one (a sheath heater is used to ensure a uniform temperature distribution in the substrate surface), while the substrate heating chamber 6026 has a four-stage elevator structure, thus allowing a maximum of four substrates to be heated at the same time to achieve remarkable reduction in processing time. Also, in this embodiment, since the substrate heating chamber 6026 has a five-stages sheath heater, i.e. one stage more than the number of the substrates, the substrate can be heated from opposite sides in the same way irrespective of which stage the substrate is accommodated in. The heated substrate is transferred to the substrate-mask stock chamber 6024, where it can be cooled. This process allows the following substrates to be quickly carried to the vacant stage of the substrate heating chamber 6026, resulting in reduction in processing time.

Subsequently, after the vacuum heating, the substrate is transferred from the transfer chamber 6002 to the vapor deposition chamber 6027Ha, where it is subjected to vacuum deposition to form a hole injection layer or a hole transport layer. Then, the substrate is transferred from the transfer chamber 6002 through the delivery chamber 6012 which is constantly maintained under a vacuum, to the transfer chamber 6003 which is constantly maintained under a vacuum.

Thereafter, the substrate is transferred to the 6027Ra, 6027Ga, 6027Ba, and 6027Ea connected to the transfer chamber 6003 as necessary, where organic layers, such as a red light emitting layer, a green light emitting layer, a blue light emitting layer, and an electron transport layer or an electron injection layer, are formed by a vacuum deposition method. The vapor deposition chambers 6027Ha, 6027Ra, 6027Ga, 6027Ba, and 6027Ea will now be described.

The vapor deposition chambers 6027Ha, 6027Ra, 6027Ga, 6027Ba, and 6027Ea have a movable vapor-deposition-source holder that can mount multiple vapor deposition sources (four sources in this embodiment) and so they can perform vapor deposition while moving the vapor deposition sources during vapor deposition and also easily perform multisource codeposition. Each multiple vapor deposition source has a deposition-source shutter to control whether to actually evaporate materials by switching the shutters.

It is preferable to use the following manufacturing system to mount EL materials to the vapor deposition chambers. In other words, it is preferable to use containers (typically, crucibles) in which EL materials are put by a material manufacturer for deposition. It is also preferable to mount the EL materials without contact with the atmosphere, so that it is preferable to put the crucibles into deposition chambers as sealed in second containers during transportation from the material manufacturer. Desirably, the vapor-deposition plenum chambers 6027Hb, 6027Rb, 6027Gb, 6027Bb, and 6027Eb having vacuum exhaust means and connected to the vapor deposition chambers 6027Ha, 6027Ra, 6027Ga, 6027Ba, and 6027Ea are maintained in a vacuum or an inert gas atmosphere, in which the crucibles are taken out from the second containers and mounted to the vapor-deposition-source holders of the vapor deposition chambers. Accordingly, EL material can not only be mounted to the deposition sources without opening the vapor deposition chambers 6027Ha, 6027Ra, 6027Ga, 6027Ba, and 6027Ea to the air but also the crucibles and the EL materials contained in the crucibles can be maintained in a clean condition until the time immediately before vapor deposition.

Correct selection of EL materials to be used in the vapor deposition chambers 6027Ha, 6027Ra, 6027Ga, 6027Ba, and 6027Ea allows formation of light emitting elements that exhibit single-color (for example, white) or full-color (red, green, and blue) light emission as the entire light emitting elements.

Note that organic compound layers that emit white light are roughly classified into a three-wavelength type that contains the three primary colors, red, green, and blue, and a two-wavelength type that uses the complementary-color relationship between blue and yellow or blue-green and orange. When the white-emitting device of the three-wavelength type is manufactured by forming all organic compound layers in only one deposition chamber, aromatic diamante diphenylamine derivative (TPD) for forming a white-emitting layer is prepared for a first deposition source, 3-(4-tert-butylphenyl)-4-(4-ethylphenyl)-5-(mubiphenynyl)-1,2,4-triazole (hereinafter, expressed as p-EtTAZ) for forming a white-emitting layer is prepared for a second deposition source, $Alq_3$ for forming a white-emitting layer is prepared for a third deposition layer, and NileRed which is a red-emitting color dye is prepared for a fourth deposition source, respectively. The materials can be evaporated in order from the first to fourth to deposit the respective layers. Specifically, the first to fourth deposition sources are first heated in advance. At that time, the deposition-source shutters mounted to the deposition sources are kept closed. The first deposition-source shutter is next opened to deposit TPD on the substrate and then closed. Thereafter, the second deposition-source shutter is opened to deposit p-EtTAZ onto the substrate and then closed. Subsequently, the third deposition-source shutter is opened to deposit $Alq_3$ on the substrate and then closed. Furthermore, the third and fourth deposition-source shutters are opened to form a codeposition layer of $Alq_3$ and NileRed and then closed. Finally, the third deposition-source shutter is again opened to deposit $Alq_3$ and then closed. Thus the layers of TPD, p-EtTAZ, $Alq_3$, $Alq_3$: NileRed, and $Alq_3$ can be formed on the substrate in that order by the series of procedures. The third deposition-source shutter may be held opened in the interface between the first $Alq_3$ layer and the $Alq_3$:NileRed layer and the interface between the $Alq_3$:NileRed layer and the last $Alq_3$ layer.

After the layers containing organic compounds have been deposited as appropriate by the foregoing processes, the substrate is transferred from the transfer chamber 6003 through the delivery chamber 6013, which is constantly maintained in a vacuum, to the transfer chamber 6004 which is constantly maintained in a vacuum.

A cathode (transparent electrode) can be formed by a sputtering method. The substrate can be transferred to the sputtering chamber 6030 or the sputtering chamber 6031 as appropriate to form a transparent conductive film typified by ITO by sputtering.

Subsequently, a cathode (reflecting electrode) is formed. A metal electrode, for example, Al may be deposited by a vacuum deposition method using resistance heating in the vapor deposition chamber 6028 or 6029 or, alternatively, by the sputtering chamber 6030 or 6031.

Finally, a $CaF_2$ or ZnO transparent protective film is formed in the vapor deposition chamber 6028 or 6029.

The light emitting element with a multilayer structure is formed in that way.

The substrate having light emitting elements is transferred from the transfer chamber 6004 to the delivery chamber 6014. The substrate is further transferred from the delivery chamber 6014 via the transfer chamber 6005 to the substrate/opposing-substrate stock chamber 6035. The substrate/opposing-substrate stock chamber 6035 is a chamber for temporarily stocking substrates and opposing substrates and so has a multistage elevator structure. The stages are used both for substrates and opposing substrates. In this embodiment, the substrate/opposing-substrate stock chamber 6035 has a 24-stage elevator structure, in which, for large substrates and large opposing substrates, part of the inputted substrates and opposing substrates can be accommodated, while for small substrates and small opposing substrates, all of the inputted substrates (trays) and opposing substrates (trays) can be accommodated. Accordingly, when no vacant stage is present in the substrate/opposing-substrate stock chamber 6035, the substrates can be held in standby in the delivery chamber 6014 until the stage becomes available. Between the substrate/opposing-substrate stock chamber 6035 and the transfer chamber 6005, no gate etc. for partition is provided and as such, the substrate/opposing-substrate stock chamber 6035 is integrated with the transfer chamber 6005 in terms of space.

The transfer chamber 6005 needs to be evacuated sufficiently to remove water, oxygen, etc. as much as possible before passing lots. However, since the transfer chamber 6005 is always maintained in a $N_2$ atmospheric pressure after starting to pass the lots, the delivery chamber 6014 must be vented when a substrate is transferred to the transfer chamber 6005. After the transfer of the substrate to the transfer chamber 6005, the delivery chamber 6014 is evacuated again to allow the following substrate to be transferred from the transfer chamber 6004. Briefly, the delivery chamber 6014 repeats the exhaustion and ventilation every time a substrate passes through.

A method for processing the opposing substrate will be described in sequence.

After the process of exhausting and venting the opposing-glass $N_2$ displacement chamber 6032 more than one time (three times in this embodiment), the opposing substrate is transferred to the glove box 6033. By executing the exhaustion and ventilation process more than one time, the concentration of water and oxygen in the glove box is maintained in a minimum low concentration.

In the glove box 6033, a preprocess for the opposing substrate (preparation of a sealing agent) is performed. The substrate is transferred to a seal dispenser portion, where a sealing agent (a UV curable resin in this embodiment) for finally bonding it with a substrate having light emitting elements is applied to the opposing substrate with the seal dispenser. Two kinds of sealing agent are used, a transparent sealing agent for covering the entire pixel region and another high-viscosity sealing agent containing a gap material (a filler, fine particles, etc.) for holding the space between the two substrates. The patterning of application is performed such that the low-viscosity sealing agent covers the entire pixel region and the high-viscosity sealing agent surrounds the entire pixel region. The seal dispenser portion has a glove (not shown) for carrying out various manual adjustment of the seal dispenser. The sealing agent can be prepared in the glove box 6033 through the opposing-glass $N_2$ displacement chamber 6032 from the exterior in advance before the lots are passed.

After the process of exhausting and venting the preparation chamber 6034 has been executed more than one time (two times in this embodiment), the preparation chamber 6034 is finally vented again. Thereafter, the opposing substrate is transferred from the preparation chamber 6034 via the transfer chamber 6005 to the substrate/opposing-substrate stock chamber 6035. However, when no vacant stage is present in the substrate/opposing-substrate stock chamber 6035, the opposing substrate can be held in standby in the preparation chamber 6034 until the stage becomes available.

A process of bonding the substrate and the opposing substrate together which are temporarily stocked in the substrate/opposing-substrate stock chamber 6035 will be described.

The substrate and the opposing substrate are transferred from the substrate/opposing-substrate stock chamber 6035 via the transfer chamber 6005 to the sealing chamber 6036. Thereafter, after the substrate and the opposing substrate have been aligned with each other, they are bonded together and pressurized. Then the sealing agent is cured to integrate the substrate and the opposing substrate into one panel. In this embodiment, the sealing agent is a UV curable resin. The sealing chamber 6036 includes a UV-emitting mechanism, which emits ultraviolet light from the opposing substrate side (lower side).

The finished panel is transferred to the extraction chamber 6037 via the transfer chamber 6005. The extraction chamber can mount two large cassettes (24 stages) used in the cassette chamber 6020b and the opposing-glass $N_2$ displacement chamber 6032 or four sets of tray cassettes (four stages), which can be selected by replacing the stages of the extraction chamber 6037. After completion of all the process for the substrates and the opposing substrates, the panel accommodated in the cassette can be extracted from the extraction chamber.

The use of the manufacturing unit allows manufacturing of a high-reliable light emitting element.

Embodiment 2

In this embodiment, an electrical apparatus including the light emitting element of the present invention as display is shown by way of example.

This embodiment shows an example of the display device of the invention applied to a cellular phone which is a representative of personal digital assistants.

Figure 8:
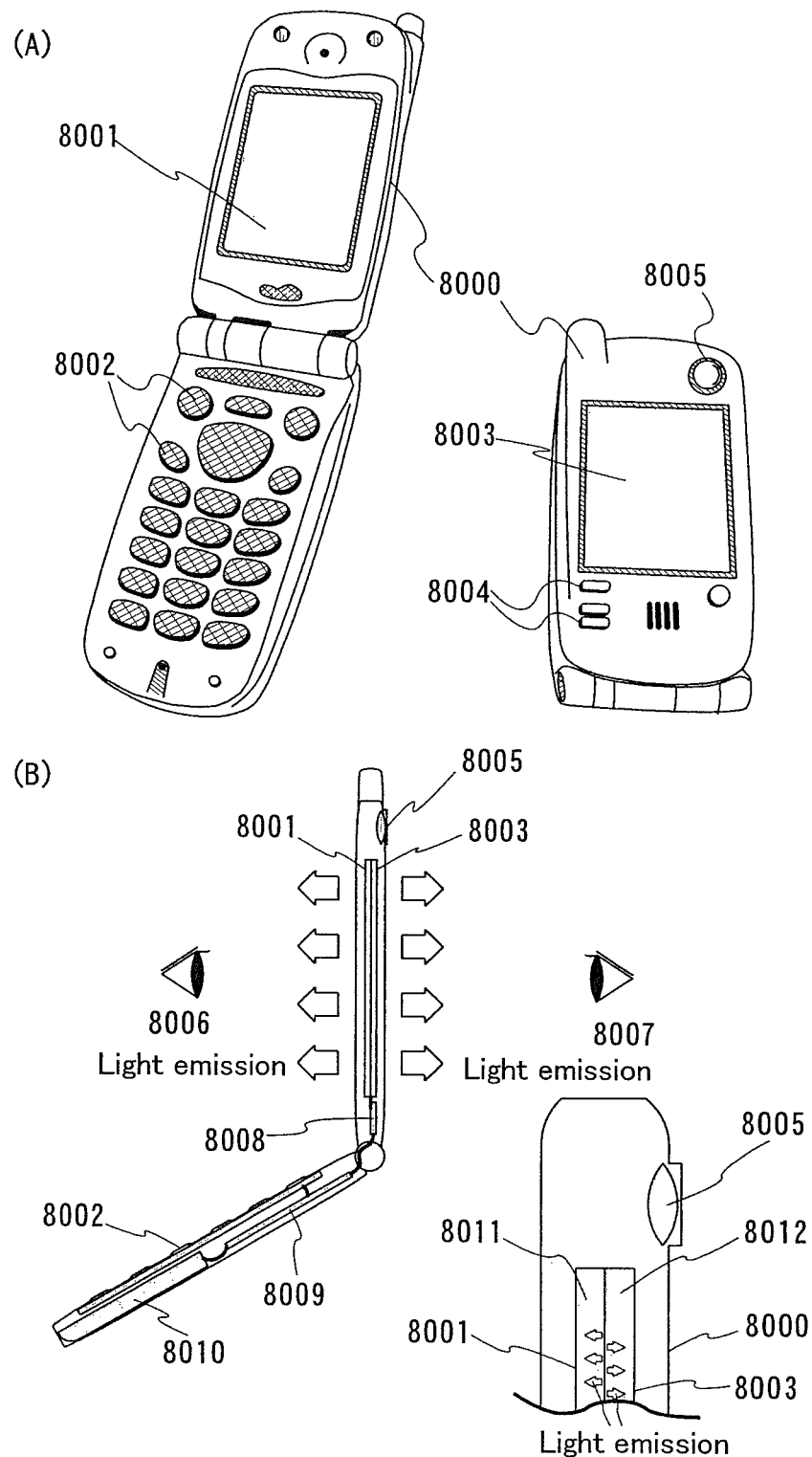
FIGS. 8(A) and 8(B) are diagrams of Embodiment 2 of the present invention.

Referring to FIG. 8(A), the use of the display device of the invention allows double-sided display with one display device, thus allowing reduction in the thickness of a casing 8000 even with a double-sided display device.

An example of usage is shown in which a first display surface 8001 is principally used as a display surface when the device is opened. Screen operation is performed with operation buttons 8002. Although a second display surface 8003, which is principally used with the device closed, had to be small because of the space, the invention allows viewing of e-mails and Web sites by using the second display surface 8003 having a display size equal to that of the first display surface 8001. Operation in a closed state is executed with operation buttons 8004.

While cellular phones with a digital camera have recently been spread extensively, the invention allows shooting while monitoring the second display surface 8002 with wide display region also in shooting with a lens 8005 directed to this side.

FIG. 8(B) shows the cellular phone of FIG. 8(A) viewed just from the side. When the first display surface 8001 and the second display surface 8003 are displayed at the same time, both a photographing person and a photographed person can view a monitor image, allowing the photographing person to release a shutter after the photographed person makes sure that the angle of photographing etc. are satisfied. Such photographing facilitates the communication between the photographing person and the photographed person, offering the advantage of reducing photographing errors. Reference numeral 8006 denotes a photographing person, numeral 8007 a photographed person, numeral 8008 a display controller, 8009 a body-driving module, numeral 8010 a battery, and numeral 8011a first substrate.

Such method can be applied also for digital cameras and digital video cameras.

Embodiment 3

This embodiment show an application of the double-sided light emitting element of the invention, formed on a film substrate, to an electronic book.

Figure 9:
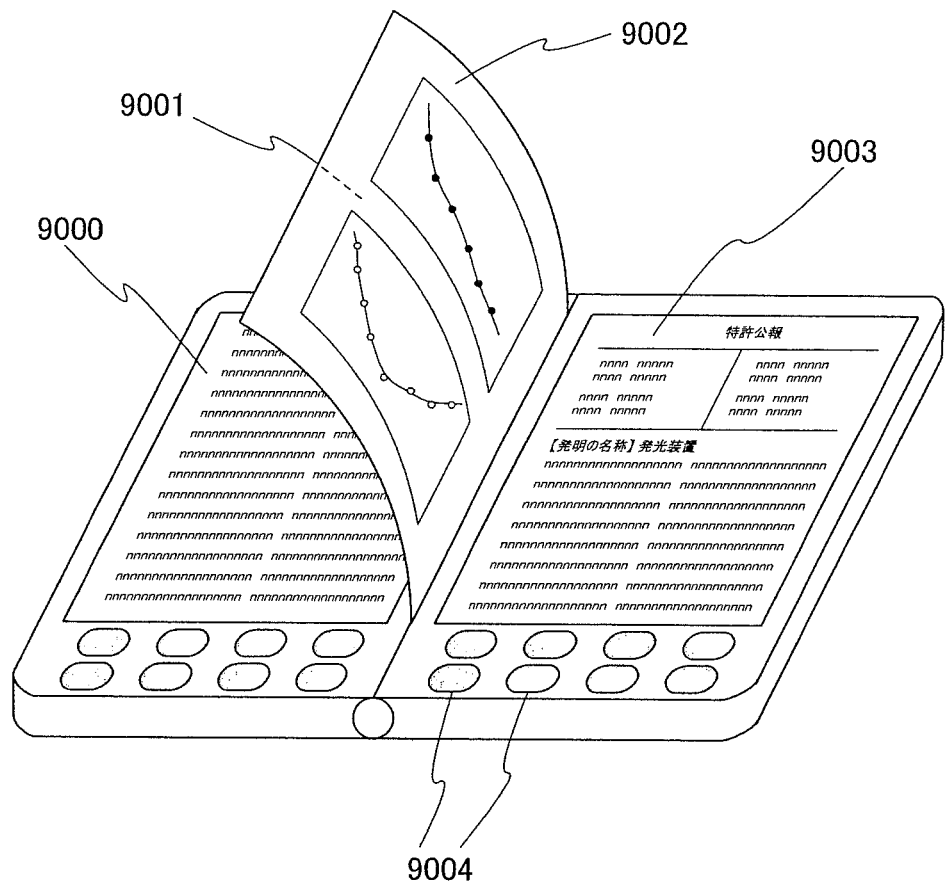
FIG. 9 is a diagram of Embodiment 3 of the present invention.

Electronic books can display multiple pages at the same time by using a film-form double-sided light emitting display panel according to the invention. As shown in FIG. 9, a general single-sided light emitting element is used for a first display surface 9000 and a fourth display surface 9003, in the center of which a second display surface 9001 and a third display surface 9002 which are the display devices of the invention are placed, so that a total of four pages can be displayed at the same time.

In the electronic book of the embodiment, the first display surface 9000 and the fourth display surface 9003, shown in FIG. 9, are general single-sided light emitting display panels fixed to the body of the electronic book, so that the substrates need not to be films but may be general glass substrates.

The first display surface 9000 and the fourth display surface 9003 may be of either a bottom emission type in which emitted light is extracted from the substrate or a top emission type in which emitted light is extracted from the deposition surface.

On the other hand, the second display surface 9001 and the third display surface 9002 are made of a film-form double-sided light emitting display panel incorporating the invention, which is manufactured by depositing electrodes and EL layers on a film substrate made of plastic etc. A method for sealing them includes a method of bonding opposing films with a transparent adhesive agent and a method of covering the entire substrate with a protective film made of silicon nitride etc. by a sputtering method or a CVD method.

Figure 12:
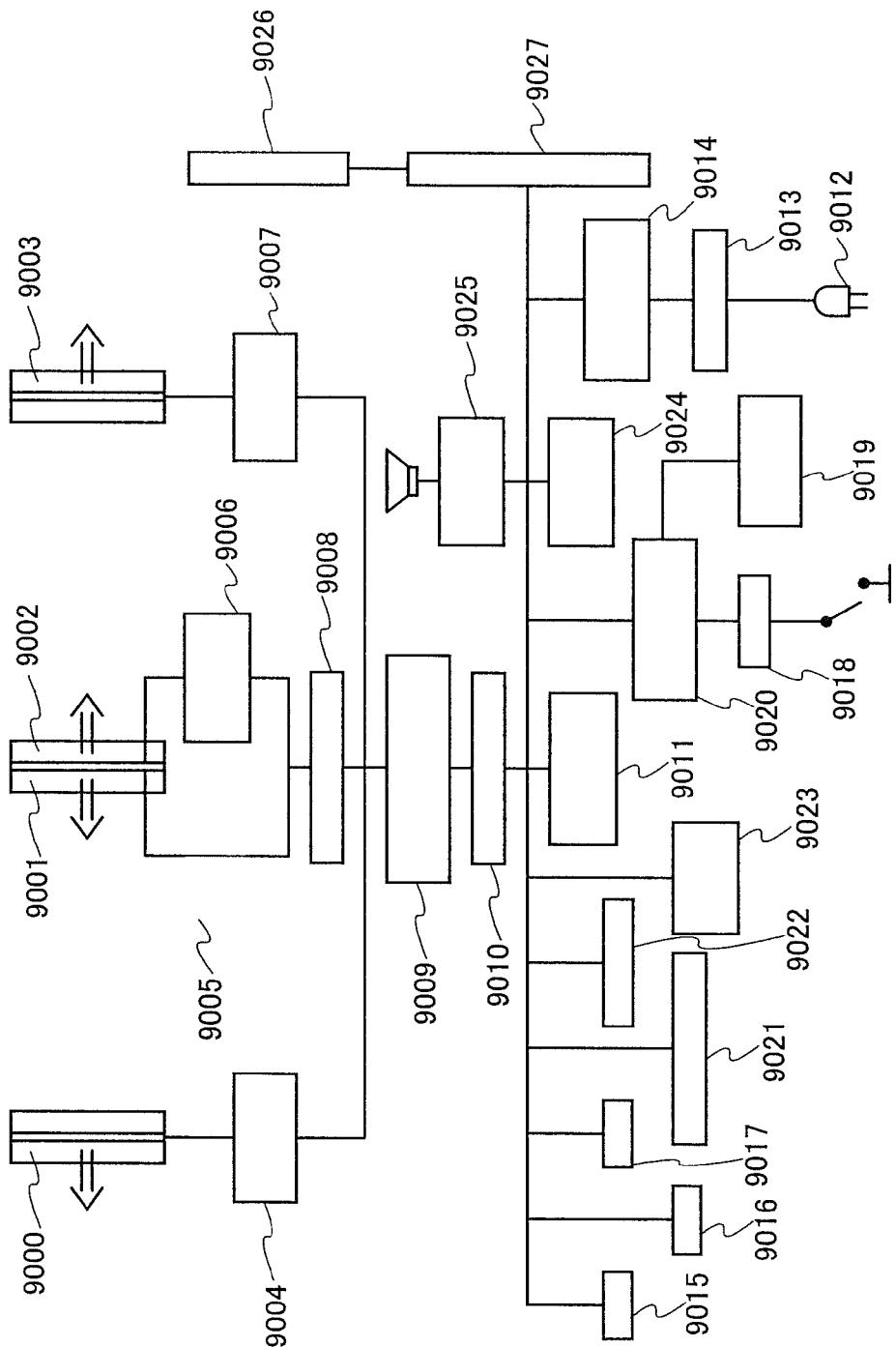
FIG. 12 is a diagram of the structure of Embodiment 3 of the present invention.

The structure of the electronic book of the embodiment is shown in FIG. 12.

The electronic book of this embodiment includes a power supply 9012, a battery 9013, a power-supply controller 9014, a CPU 9015, an ROM 9016, an RAM 9017, a modem 9018, a wireless phone unit 9019, a modem controller 9020, a hard disk 9021, a CD-ROM 9022, a memory card 9023, an audio-signal processing circuit 9024, an audio output unit 9025, an input controller 9027 which processes a signal outputted from an operation button 9026, a video-signal processing circuit 9011, a signal processing circuit 9010, a video-signal control circuit 9009, and signal-dividing circuits 9004 to 9008 built in.

Since the electronic book of the embodiment includes recording media such as the hard disk 9021, the CD-ROM 9022, and the memory card 9023, from which necessary information can be extracted to display it on a display surface. Also, the recording media can be connected from the exterior. The electronic book of the embodiment can also display information from the modem 9018 connected to an external network and from the wireless phone unit 9019 by processing them with the modem controller 9020.

The signals from the recording media and the exterior are processed by the video-signal processing circuit 9011, passes through the signal processing circuit 9010 and the video-signal control circuit 9009, and inputted to the signal-dividing circuits 9004 to 9008 connected to the respective display surfaces. Although the second display surface 9001 and the third display surface 9002 are formed on the same substrate, they can input independent signals from the signal-dividing circuits 9005 and 9006, thus capable of displaying independent images.

The electronic book of the embodiment can output not only images but also a signal processed by the audio-signal processing circuit 9024 with the audio output unit 9025.

The electronic book with such functions is convenient in reading text while referring to a diagram in another page, reading text while referring to a dictionary, etc.

Embodiment 4

Figure 10:
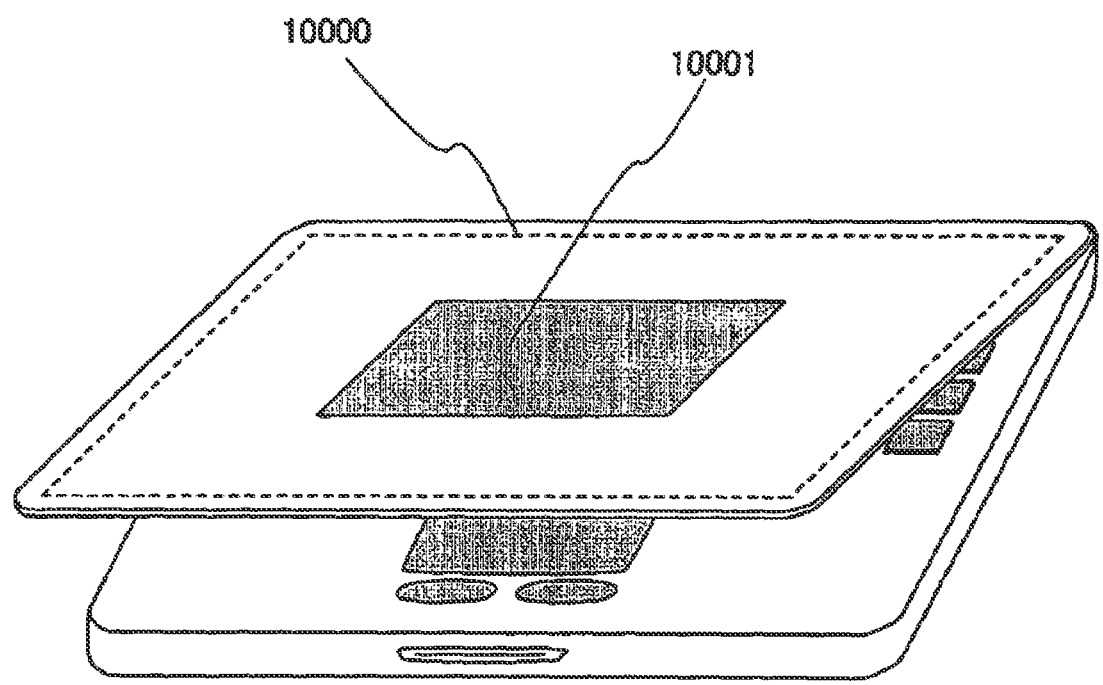
FIG. 10 is a diagram of Embodiment 4 of the present invention.

FIG. 10 shows an example of a notebook computer incorporating the display device of the invention.

When the invention is used for the display device of a notebook computer, the thickness can be reduced even with a double-sided display screen, as shown in FIG. 10. Preferable manufacturing examples include a notebook computer of the type in which two displays can be used properly between a large-area main display 10000 used as a general computer display device and a small-area subdisplay 1001 which displays minimum essential information when the main display 10000 is interrupted.

The computer can be manufactured by the above-described procedure. The main display 10000 and the subdisplay 10001 operate independently, thus allowing different images to be displayed.

When the user of the computer is viewing the main display 10000, the subdisplay 10001 can be turned off or can display some message to another person.

When the user of the computer stops the operation to close the display portion with only the subdisplay 10001 exposed to the exterior, the main display 10000 can be turned off. The subdisplay 10001 can be turned off depending on the intension of the user, allowing only minimum essential information to be displayed.

The display device can be used in various ways, such as to display time during the interruption of operation, to display the kind of application in use, to display e-mail reception information, and to display the destination of the operator.

What is claimed is:

1. A semiconductor device comprising:
   a first transistor;
   a second transistor whose gate electrode is electrically connected to a first terminal of the first transistor, wherein the second transistor comprising a semiconductor layer adjacent to the gate electrode of the second transistor;
   a third transistor whose gate electrode is electrically connected to the first terminal of the first transistor, wherein the third transistor comprising a semiconductor layer adjacent to the gate electrode of the third transistor;
   a first light emitting element whose first electrode is electrically connected to a first terminal of the second transistor;
   a second light emitting element whose first electrode is electrically connected to a first terminal of the third transistor;
   a first insulating film over the gate electrode of the second transistor and the gate electrode of the third transistor, wherein each of the first electrode of the first light emitting element and the first electrode of the second light emitting element is provided over the first insulating film; and
   a second insulating film over and in contact with the first electrode of the first light emitting element and the first electrode of the second light emitting element,
   wherein each of the first electrode of the first light emitting element and the first electrode of the second light emitting element is an anode.

2. The semiconductor device according to claim 1, further comprising:
   a line electrically connected to a second terminal of the second transistor and a second terminal of the third transistor.

3. The semiconductor device according to claim 2, wherein the line is a current supply line.

4. The semiconductor device according to claim 1,
   wherein the first transistor is n-type transistor,
   wherein the second transistor is p-type transistor, and
   wherein the third transistor is p-type transistor.

5. The semiconductor device according to claim 1, wherein the first electrode of the second light emitting element is provided over and in contact with an electrode of the third transistor.

6. The semiconductor device according to claim 1, wherein the first electrode of the first light emitting element comprises a material selected from the group consisting of Ti, TiN, TiSixNy, Ni, W, WSix, WNx, WSixNy, NbN, Mo, Cr, Pt, Se, Pd, Ir, and Au.

7. The semiconductor device according to claim 1, wherein the first electrode of the second light emitting element comprises indium tin oxide.

8. A semiconductor device comprising:
   a first transistor;
   a second transistor whose gate electrode is electrically connected to a first terminal of the first transistor, wherein the second transistor comprising a semiconductor layer adjacent to the gate electrode of the second transistor;
   a third transistor whose gate electrode is electrically connected to the first terminal of the first transistor, wherein the third transistor comprising a semiconductor layer adjacent to the gate electrode of the third transistor;
   a first light emitting element whose first electrode is electrically connected to a first terminal of the second transistor;
   a second light emitting element whose first electrode is electrically connected to a first terminal of the third transistor;
   a first insulating film over the gate electrode of the second transistor and the gate electrode of the third transistor, wherein each of the first electrode of the first light emitting element and the first electrode of the second light emitting element is provided over the first insulating film; and
   a second insulating film over and in contact with the first electrode of the first light emitting element and the first electrode of the second light emitting element.

9. The semiconductor device according to claim 8, further comprising:
   a line electrically connected to a second terminal of the second transistor and a second terminal of the third transistor.

10. The semiconductor device according to claim 9, wherein the line is a current supply line.

11. The semiconductor device according to claim 8,
    wherein the first transistor is n-type transistor,
    wherein the second transistor is p-type transistor, and
    wherein the third transistor is p-type transistor.

12. The semiconductor device according to claim 8, wherein the first electrode of the second light emitting element is provided over and in contact with an electrode of the third transistor.

13. The semiconductor device according to claim 8, wherein the first electrode of the first light emitting element comprises a material selected from the group consisting of Ti, TiN, TiSixNy, Ni, W, WSix, WNx, WSixNy, NbN, Mo, Cr, Pt, Se, Pd, Ir, and Au.

14. The semiconductor device according to claim 8, wherein the first electrode of the second light emitting element comprises indium tin oxide.

15. An electronic book comprising:
    a first single-sided light emitting display panel having a first display surface;
    a double-sided light emitting display panel having a second display surface and a third display surface;
    a second single-sided light emitting display panel having a fourth display surface;
    wherein the double-sided light emitting display panel is provided between the first single-sided light emitting display panel and the second single-sided light emitting display panel, and
    wherein a substrate of the double-sided light emitting display panel is a film substrate.

16. The electronic book according to claim 15, further comprising:
    a first transistor;
    a second transistor whose gate terminal is electrically connected to a first terminal of the first transistor;
    a third transistor whose gate terminal is electrically connected to the first terminal of the first transistor;
    a first light emitting element whose first electrode is electrically connected to a first terminal of the second transistor;

a second light emitting element whose first electrode is electrically connected to a first terminal of the third transistor;

a current supply line electrically connected to a second terminal of the second transistor through a first analog switch, and electrically connected to a second terminal of the third transistor through a second analog switch; and a source signal line electrically connected to a second terminal of the first transistor, wherein the first analog switch and the second analog switch are configured to be exclusively operated.

17. The electronic book according to claim 15, further comprising:

a first transistor;

a second transistor whose gate terminal is electrically connected to a first terminal of the first transistor;

a third transistor whose gate terminal is electrically connected to the first terminal of the first transistor;

a first light emitting element whose first electrode is electrically connected to a first terminal of the second transistor; and a second light emitting element whose first electrode is electrically connected to a first terminal of the third transistor;

a current supply line electrically connected to a second terminal of the second transistor through a first analog switch, and electrically connected to a second terminal of the third transistor through a second analog switch; and a source signal line electrically connected to a second terminal of the first transistor, wherein the first analog switch and the second analog switch are configured to be independently controlled.

18. The electronic book according to claim 15, wherein when the electronic book is closed, the first display surface and the second display surface face each other while the third display surface and the fourth display surface face each other.

19. The electronic book according to claim 15, further comprising a power supply, a battery, a CPU, a video-signal processing circuit, and a signal processing circuit.

20. The electronic book according to claim 15, further comprising a hard disk.

21. The electronic book according to claim 15, further comprising a wireless phone unit.

22. An electronic book comprising:

a first single-sided light emitting display panel having a first display surface;

a double-sided light emitting display panel having a second display surface and a third display surface;

a second single-sided light emitting display panel having a fourth display surface;

wherein the double-sided light emitting display panel is provided between the first single-sided light emitting display panel and the second single-sided light emitting display panel, wherein a substrate of the double-sided light emitting display panel is a film substrate, and wherein a substrate of the first single-sided light emitting display panel and the second single-sided light emitting display panel is a glass substrate.

23. The electronic book according to claim 22, further comprising:

a first transistor;

a second transistor whose gate terminal is electrically connected to a first terminal of the first transistor;

a third transistor whose gate terminal is electrically connected to the first terminal of the first transistor;

a first light emitting element whose first electrode is electrically connected to a first terminal of the second transistor;

a second light emitting element whose first electrode is electrically connected to a first terminal of the third transistor;

a current supply line electrically connected to a second terminal of the second transistor through a first analog switch, and electrically connected to a second terminal of the third transistor through a second analog switch; and a source signal line electrically connected to a second terminal of the first transistor, wherein the first analog switch and the second analog switch are configured to be exclusively operated.

24. The electronic book according to claim 22, further comprising:

a first transistor;

a second transistor whose gate terminal is electrically connected to a first terminal of the first transistor;

a third transistor whose gate terminal is electrically connected to the first terminal of the first transistor;

a first light emitting element whose first electrode is electrically connected to a first terminal of the second transistor; and a second light emitting element whose first electrode is electrically connected to a first terminal of the third transistor;

a current supply line electrically connected to a second terminal of the second transistor through a first analog switch, and electrically connected to a second terminal of the third transistor through a second analog switch; and a source signal line electrically connected to a second terminal of the first transistor, wherein the first analog switch and the second analog switch are configured to be independently controlled.

25. The electronic book according to claim 22, wherein when the electronic book is closed, the first display surface and the second display surface face each other while the third display surface and the fourth display surface face each other.

26. The electronic book according to claim 22, further comprising a power supply, a battery, a CPU, a video-signal processing circuit, and a signal processing circuit.

27. The electronic book according to claim 22, further comprising a hard disk.

28. The electronic book according to claim 22, further comprising a wireless phone unit.

29. An electronic book comprising:

a first single-sided light emitting display panel having a first display surface;

a double-sided light emitting display panel having a second display surface and a third display surface;

a second single-sided light emitting display panel having a fourth display surface;

wherein the double-sided light emitting display panel is provided between the first single-sided light emitting display panel and the second single-sided light emitting display panel, wherein a substrate of the double-sided light emitting display panel is a film substrate, wherein the double-sided light emitting display panel comprises a pixel portion in which pixels formed of first and second light emitting elements are arranged in matrix form, wherein the first light emitting element comprises a first electrode, an organic layer over the first electrode, and a second electrode over the organic layer, wherein the first electrode is a translucent electrode, and the second electrode is a nontranslucent electrode, and wherein the second light emitting element comprises a third electrode, the organic layer over the third electrode, and a fourth electrode over the organic layer, wherein the third electrode is a nontranslucent electrode, and the fourth electrode is a translucent electrode.

30. The electronic book according to claim 29, further comprising:

an organic resin film covering an end portion the first electrode and an end portion of the third electrode, wherein the organic resin film is provided under the organic layer.

31. The electronic book according to claim 29, further comprising:

a first transistor;

a second transistor whose gate terminal is electrically connected to a first terminal of the first transistor;

a third transistor whose gate terminal is electrically connected to the first terminal of the first transistor;

a current supply line electrically connected to a second terminal of the second transistor through a first analog switch, and electrically connected to a second terminal of the third transistor through a second analog switch; and a source signal line electrically connected to a second terminal of the first transistor, wherein the first electrode of the first light emitting element is electrically connected to a first terminal of the second transistor, wherein the first electrode of the second light emitting element is electrically connected to a first terminal of the third transistor, and wherein the first analog switch and the second analog switch are configured to be exclusively operated.

32. The electronic book according to claim 29, further comprising:

a first transistor;

a second transistor whose gate terminal is electrically connected to a first terminal of the first transistor;

a third transistor whose gate terminal is electrically connected to the first terminal of the first transistor;

a current supply line electrically connected to a second terminal of the second transistor through a first analog switch, and electrically connected to a second terminal of the third transistor through a second analog switch; and a source signal line electrically connected to a second terminal of the first transistor, wherein the first electrode of the first light emitting element is electrically connected to a first terminal of the second transistor, wherein the first electrode of the second light emitting element is electrically connected to a first terminal of the third transistor, and wherein the first analog switch and the second analog switch are configured to be independently controlled.

33. The electronic book according to claim 29, wherein when the electronic book is closed, the first display surface and the second display surface face each other while the third display surface and the fourth display surface face each other.

34. The electronic book according to claim 29, further comprising a power supply, a battery, a CPU, a video-signal processing circuit, and a signal processing circuit.

35. The electronic book according to claim 29, further comprising a hard disk.

36. The electronic book according to claim 29, further comprising a wireless phone unit.

* * * * *

UNITED STATES PATENT AND TRADEMARK OFFICE
CERTIFICATE OF CORRECTION

PATENT NO.         : 8,860,011 B2
APPLICATION NO.    : 13/334150
DATED              : October 14, 2014
INVENTOR(S)        : Teruyuki Fujii and Shunpei Yamazaki Page 1 of 1

It is certified that error appears in the above-identified patent and that said Letters Patent is hereby corrected as shown below:

In the Specification

Column 12, line 28, after "cassettes" delete ","; and

Column 17, line 36, replace "8011a" with --8011 a--.

Signed and Sealed this
Fifteenth Day of September, 2015

Michelle K. Lee
*Director of the United States Patent and Trademark Office*